United States Patent
Harada et al.

(10) Patent No.: US 9,443,718 B2
(45) Date of Patent: Sep. 13, 2016

(54) METHOD OF MANUFACTURING SEMICONDUCTOR DEVICE, SUBSTRATE PROCESSING APPARATUS, AND NON-TRANSITORY COMPUTER-READABLE RECORDING MEDIUM

(71) Applicant: Hitachi Kokusai Electric Inc., Tokyo (JP)

(72) Inventors: Katsuyoshi Harada, Toyama (JP); Yoshiro Hirose, Toyama (JP); Atsushi Sano, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/102,682

(22) Filed: Dec. 11, 2013

(65) Prior Publication Data
US 2014/0170858 A1  Jun. 19, 2014

(30) Foreign Application Priority Data
Dec. 13, 2012 (JP) .................................. 2012-272124
Nov. 6, 2013 (JP) .................................. 2013-229896

(51) Int. Cl.
| | |
|---|---|
| H01L 21/31 | (2006.01) |
| H01L 21/02 | (2006.01) |
| C23C 16/30 | (2006.01) |
| C23C 16/40 | (2006.01) |
| C23C 16/455 | (2006.01) |

(52) U.S. Cl.
CPC ......... *H01L 21/0228* (2013.01); *C23C 16/308* (2013.01); *C23C 16/401* (2013.01); *C23C 16/45546* (2013.01); *H01L 21/02126* (2013.01); *H01L 21/02129* (2013.01); *H01L 21/02214* (2013.01); *H01L 21/02274* (2013.01)

(58) Field of Classification Search
CPC ............. C23C 16/308; C23C 16/401; C23C 16/45546; H01L 21/02126; H01L 21/02129; H01L 21/02214; H01L 21/02274; H01L 21/0228
USPC .......................... 438/761–763, 778, 780–794
See application file for complete search history.

(56) References Cited

U.S. PATENT DOCUMENTS

| | | | |
|---|---|---|---|
| 8,685,867 B1* | 4/2014 | Danek ............... | H01L 21/76801 257/E21.001 |
| 2004/0033372 A1* | 2/2004 | Mueller et al. ............... | 428/447 |
| 2007/0281495 A1* | 12/2007 | Mallick et al. ............... | 438/778 |
| 2009/0263647 A1* | 10/2009 | Gangopadhyay ....... | C01B 33/02 428/335 |
| 2013/0230987 A1* | 9/2013 | Draeger et al. ............... | 438/694 |

FOREIGN PATENT DOCUMENTS

| | | |
|---|---|---|
| JP | 2003-045864 A | 2/2003 |
| JP | 2004-260192 A | 9/2004 |
| JP | 2011-504651 A | 2/2011 |

* cited by examiner

*Primary Examiner* — H Tsai
(74) *Attorney, Agent, or Firm* — Volpe and Koenig, P.C.

(57) ABSTRACT

Provided is a method including forming a film including a predetermined element, oxygen and at least one element selected from a group consisting of nitrogen, carbon and boron on a substrate by performing a cycle a predetermined number of times, the cycle including supplying a source gas to the substrate wherein the source gas contains the predetermined element, chlorine and oxygen with a chemical bond of the predetermined element and oxygen, and supplying a reactive gas to the substrate wherein the reactive gas contains the at least one element selected from the group consisting of nitrogen, carbon and boron.

21 Claims, 13 Drawing Sheets

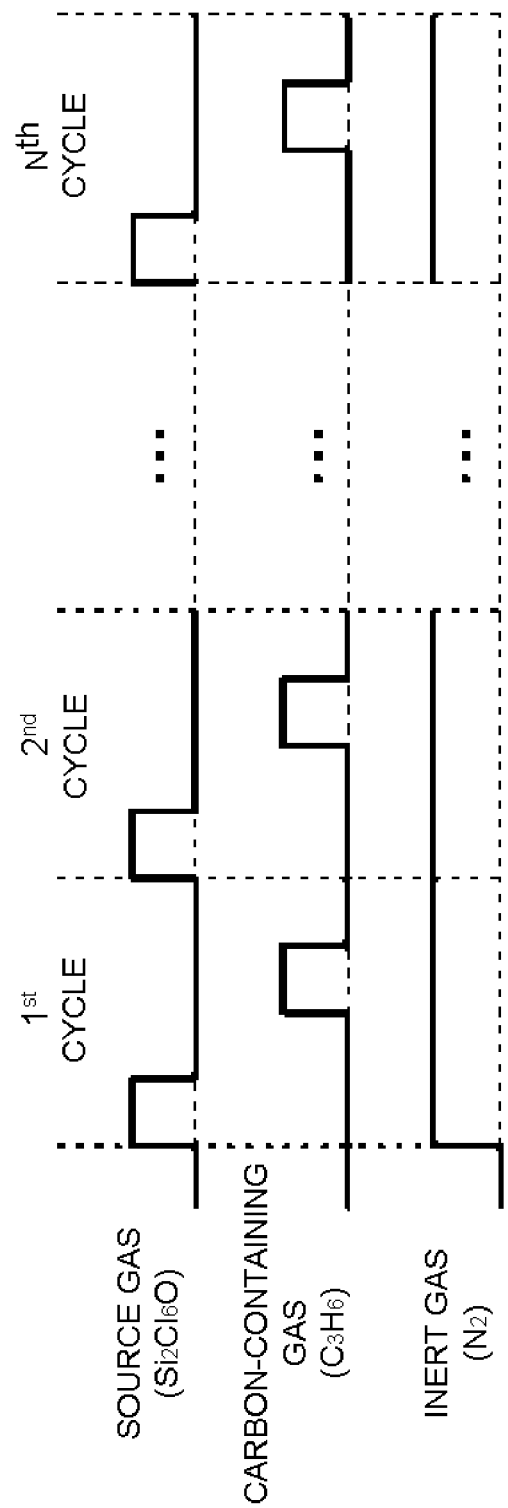

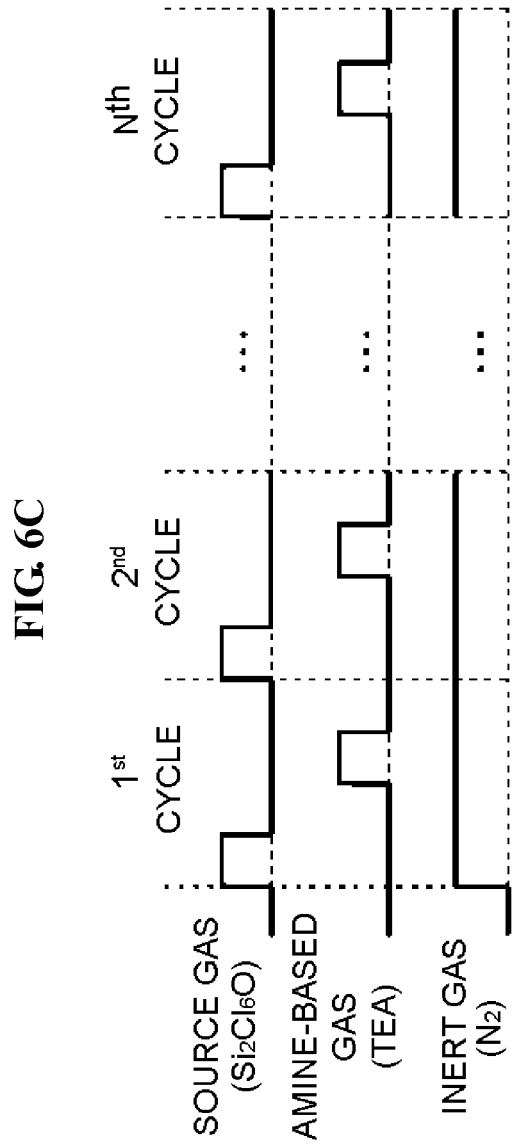

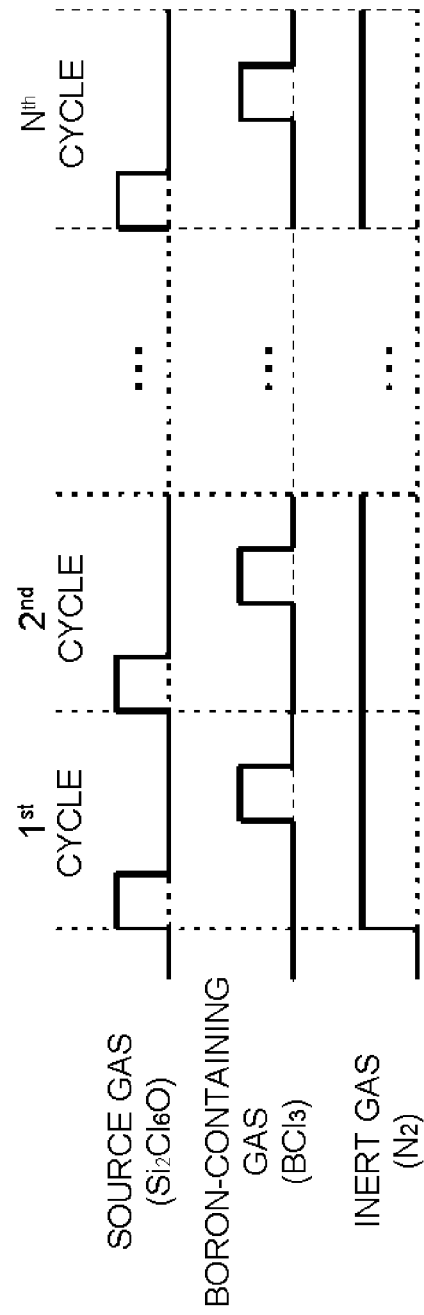

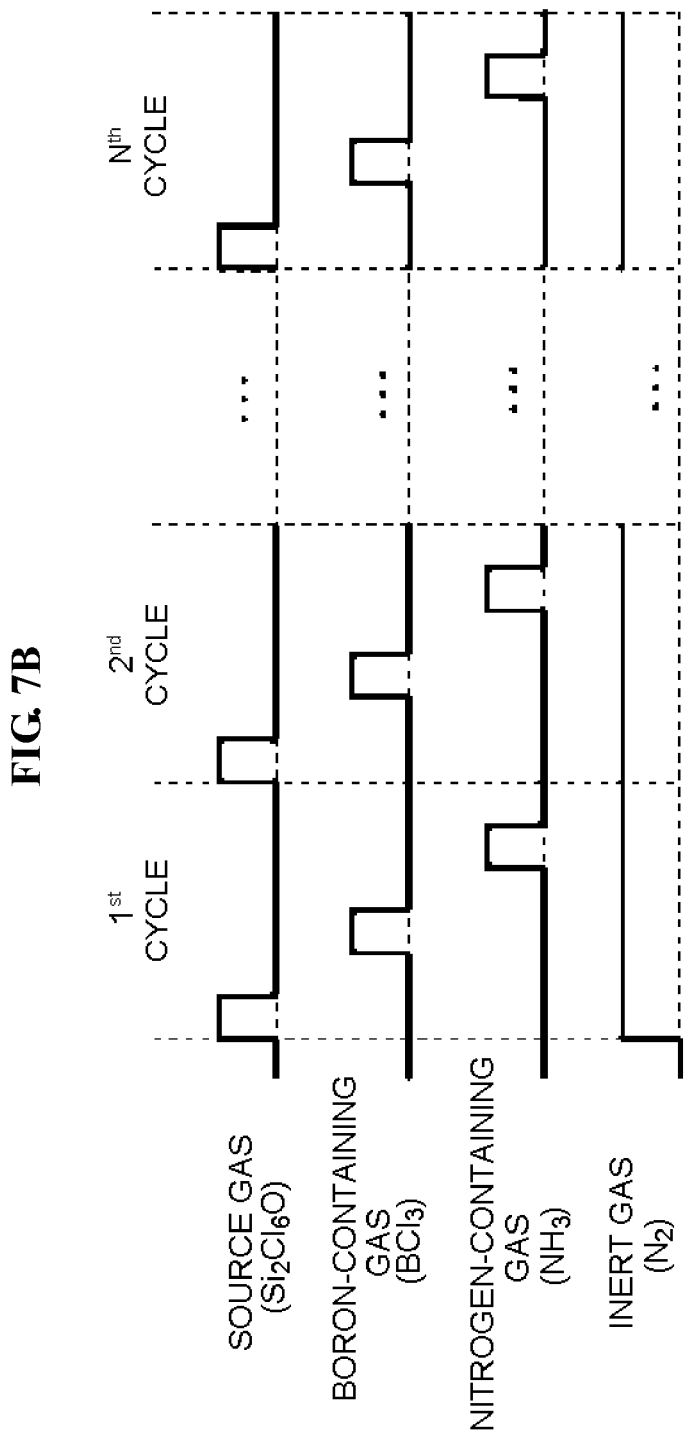

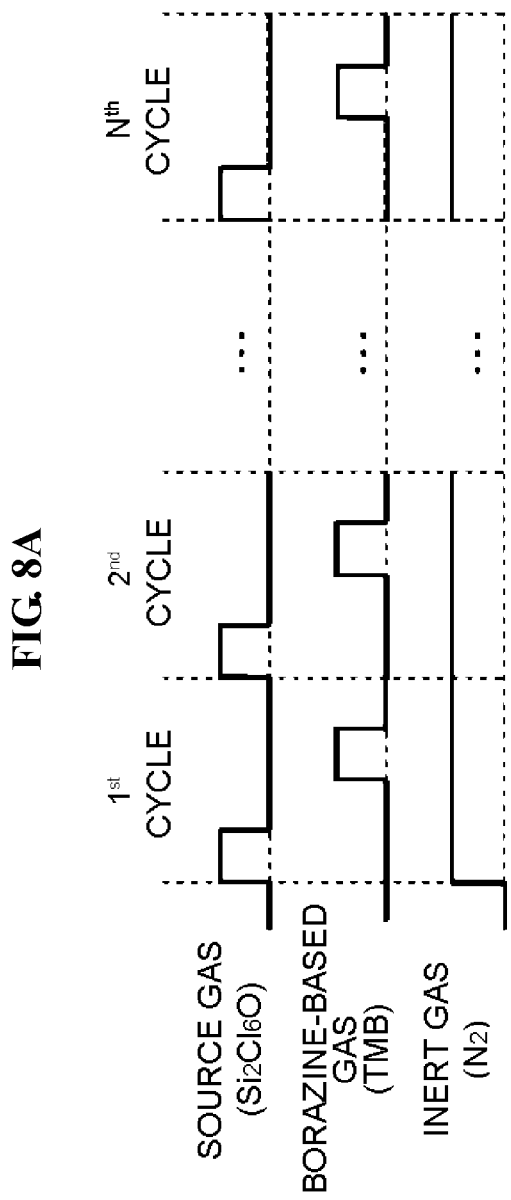

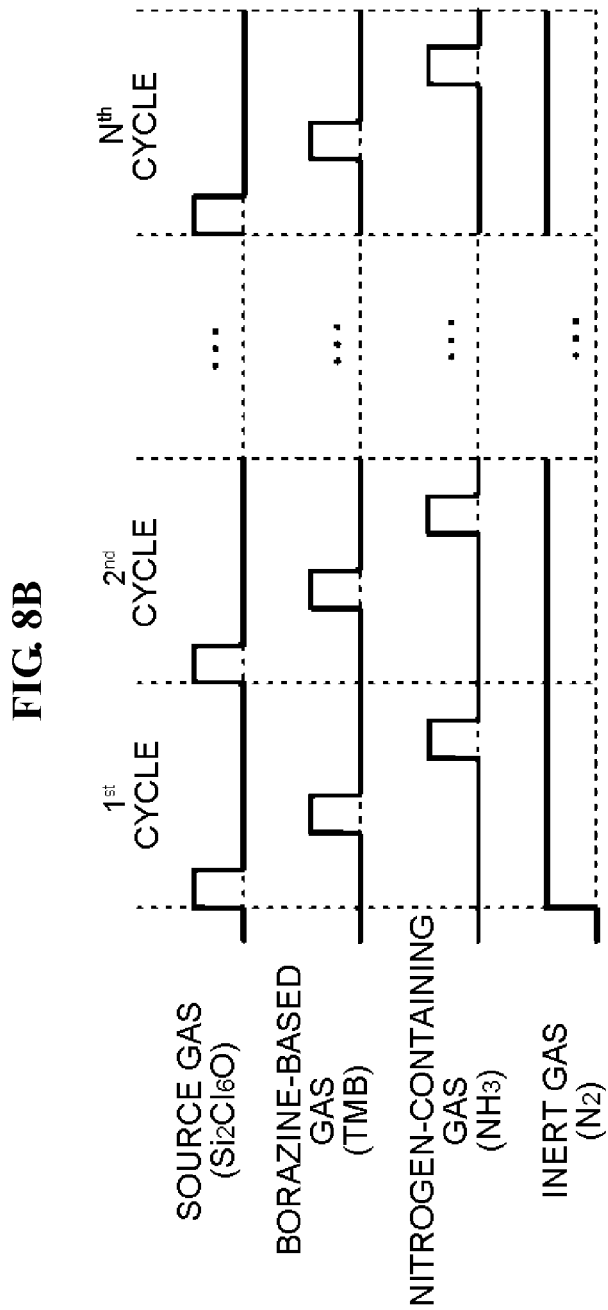

METHOD OF MANUFACTURING SEMICONDUCTOR DEVICE, SUBSTRATE PROCESSING APPARATUS, AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Applications No. 2012-272124 and No. 2013-229896 filed on Dec. 13, 2012 and Nov. 6, 2013, respectively, in the Japanese Patent Office, the entire contents of which are hereby incorporated by reference.

BACKGROUND OF THE INVENTION

1. Field of the Invention

The present invention relates to a method of manufacturing a semiconductor device including a process of forming a thin film on a substrate, a substrate processing apparatus preferably used in the process, and a non-transitory computer-readable recording medium.

2. Description of the Related Art

A flash memory includes an electron accumulation region (a floating gate) surrounded by an insulating film, and is operated according to a principle that information is written through exchange of electrons via a thin tunnel oxide film (a thin tunnel insulating film) and the electrons are held to hold the storage using an insulating property of the thin oxide film for a long time. In the flash memory, while the information is stored as the electrons or holes pass through the tunnel insulating film and are accumulated at the floating gate upon writing or deleting, an equivalent oxide thickness (EOT) of the tunnel insulating film is reduced as refinement is performed. For this reason, while a nitride film (a SiN film) having a dielectric constant larger than that of an oxide film (a SiO film) may be used as the tunnel insulating film, since the SiN film has a large defect density, the defect density should be reduced. Since a structural defect of a dangling bond or the like, which is known as a defect, is likely to be bonded to hydrogen, a film having a large number of hydrogen atoms contained in the film may be referred to as a film having a high defect density, and thus a high quality SiN film that does not include hydrogen is needed.

Patent Document

Japanese Patent Application Laid-Open No. 2003-45864

SUMMARY OF THE INVENTION

The SiN film may be formed by, for example, a chemical vapor deposition (CVD) method using dichlorosilane ($SiH_2Cl_2$) gas and ammonia ($NH_3$) gas in a temperature range of about 700° C. to 800° C. However, in the CVD method, a decrease in hydrogen due to film-forming at a high temperature region of 700° C. or more cannot be easily accomplished due to restriction in film thickness uniformity or a step coverage property, and thus there is a need for a film-forming method to replace the CVD method.

When the film-forming is performed through an atomic layer deposition (ALD) method using $SiH_2Cl_2$ gas and $NH_3$ gas instead of the CVD method, hydrogen generated by a source material remains in a temperature region of 550° C. or less, at which the ALD method is realized. For this reason, instead of formation of a silicon nitride film using $SiH_2Cl_2$ gas and $NH_3$ gas, a film-forming method which is capable of obtaining good film thickness uniformity or a good step coverage property even in a high temperature region of 700° C. or more, is needed.

The present invention is directed to providing a method of manufacturing a semiconductor device, a substrate processing apparatus and a non-transitory computer-readable recording medium, that are capable of forming a thin film having good film thickness uniformity and a good step coverage property at a low hydrogen concentration.

According to an aspect of the present invention, there is provided a method of manufacturing a semiconductor device, including forming a film including a predetermined element, oxygen and at least one element selected from a group consisting of nitrogen, carbon and boron on a substrate by performing a cycle a predetermined number of times, the cycle including:

(a) supplying a source gas to the substrate wherein the source gas contains the predetermined element, chlorine and oxygen with a chemical bond of the predetermined element and oxygen; and (b) supplying a reactive gas to the substrate wherein the reactive gas contains the at least one element selected from the group consisting of nitrogen, carbon and boron.

According to another aspect of the present invention, there is provided a substrate processing apparatus including:

a processing chamber accommodating a substrate;

a source gas supply system configured to supply a source gas to the substrate in the processing chamber wherein the source gas contains a predetermined element, chlorine and oxygen with a chemical bond of the predetermined element and oxygen;

a reactive gas supply system configured to supply a reactive gas to the substrate in the processing chamber wherein the reactive gas contains at least one element selected from a group consisting of nitrogen, carbon and boron; and a control unit configured to control the source gas supply system and the reactive gas supply system to form a film including the predetermined element, oxygen and the at least one element selected from the group consisting of nitrogen, carbon and boron on the substrate by performing a cycle a predetermined number of times, the cycle including supplying the source gas to the substrate in the processing chamber and supplying the reactive gas to the substrate in the processing chamber.

According to still another aspect, there is provided a non-transitory computer-readable recording medium storing a program for causing a computer to execute a sequence of forming a film including a predetermined element, oxygen and at least one element selected from a group consisting of nitrogen, carbon and boron on a substrate by performing a cycle a predetermined number of times, the cycle including:

supplying a source gas to the substrate in a processing chamber wherein the source gas contains the predetermined element, chlorine and oxygen with a chemical bond of the predetermined element and oxygen; and supplying a reactive gas to the substrate in the processing chamber wherein the reactive gas contains the at least one element selected from the group consisting of nitrogen, carbon and boron.

BRIEF DESCRIPTION OF THE DRAWINGS

FIGS. 6A to 6C are views showing gas supply timing according to another embodiment of the present invention.

FIGS. 7A to 7C are views showing gas supply timing according to another embodiment of the present invention.

FIGS. 8A and 8B are views showing gas supply timing according to another embodiment of the present invention.

DETAILED DESCRIPTION OF THE PREFERRED EMBODIMENTS

<Embodiments of the Present Invention>

(1) Configuration of Substrate Processing Apparatus

Figure 1:
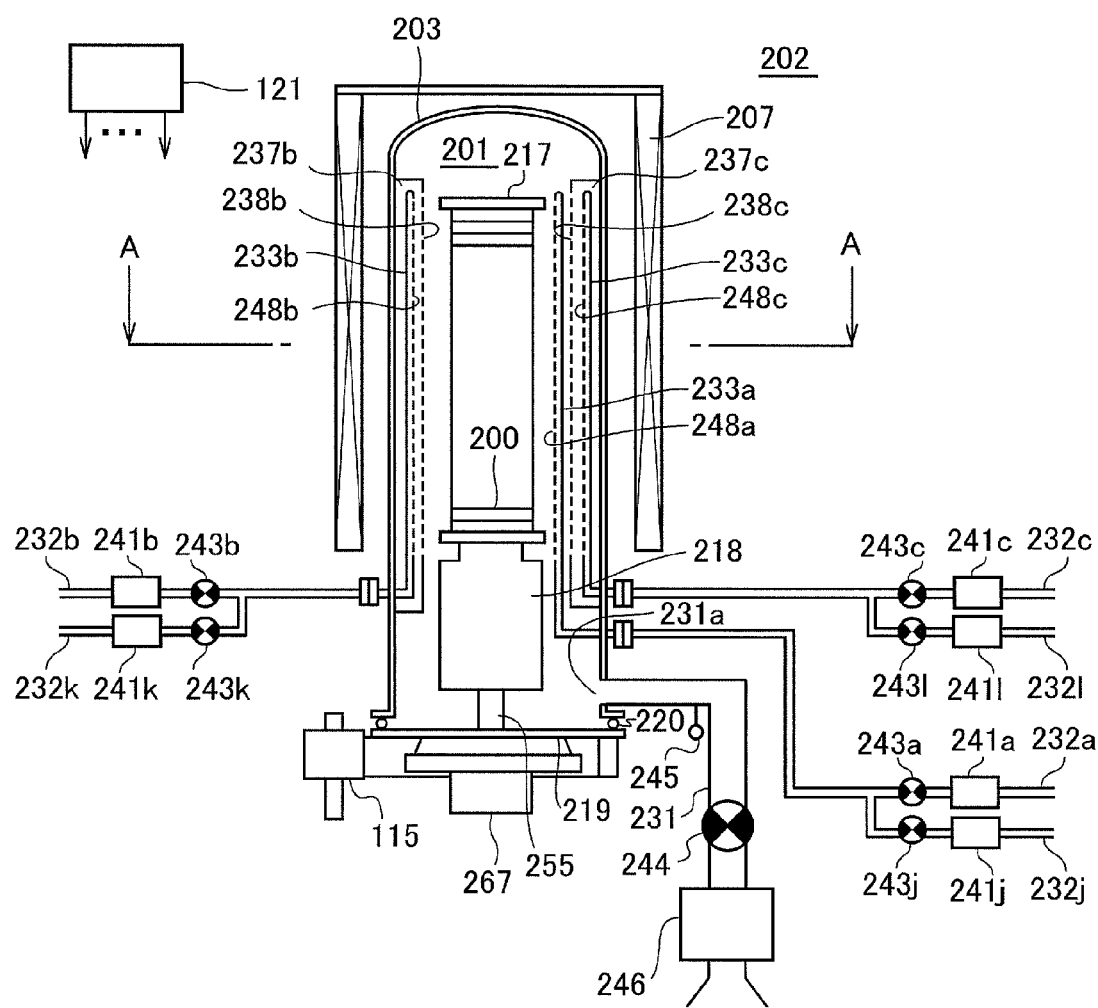
FIG. 1 is a schematic configuration view of a vertical type processing furnace of a substrate processing apparatus preferably used in an embodiment of the present invention, showing a longitudinal cross-sectional view of a processing furnace section.

As shown in FIG. 1, a processing furnace 202 includes a heater 207 serving as a heating unit (a heating mechanism). The heater 207 has a cylindrical shape and is supported by a heater base (not shown) serving as a holding plate to be vertically installed. In addition, the heater 207 functions as an activation mechanism (an excitation unit) configured to activate (excite) a gas with heat, which will be described below.

A reaction pipe 203 that constitutes a reaction container (a processing container) is installed concentrically with the heater 207 inside the heater 207. The reaction pipe 203 is formed of a thermal resistant material such as quartz ($SiO_2$), silicon carbide (SiC), or the like, and has a cylindrical shape with an upper end closed and a lower end open. A processing chamber 201 is formed at a hollow tubular section of the reaction pipe 203 and configured to accommodate wafers 200, which are substrates, in a horizontal posture by a boat 217 (to be described below) in a vertical direction while arranged in multiple stages.

A first nozzle 233a serving as a first gas introduction unit, a second nozzle 233b serving as a second gas introduction unit and a third nozzle 233c as a third gas introduction unit are installed in the processing chamber 201 to pass through a bottom sidewall of the reaction pipe 203. A first gas supply pipe 232a is connected to the first nozzle 233a. A second gas supply pipe 232b is connected to the second nozzle 233b. A third gas supply pipe 232c is connected to the third nozzle 233c. As described above, the three nozzles 233a, 233b and 233c and the three gas supply pipes 232a, 232b and 232c are installed at the reaction pipe 203, and a plurality of kinds of gases can be supplied into the processing chamber 201.

In addition, a manifold formed of a metal and configured to support the reaction pipe 203 is installed at a lower side of the reaction pipe 203, and each of the nozzles may be installed to pass through a sidewall of the metal manifold. In this case, an exhaust pipe 231 (to be described below) may be installed at the metal manifold. In addition, even in this case, the exhaust pipe 231 may be installed at a lower portion of the reaction pipe 203 other than the metal manifold. As described above, a furnace port section of the processing furnace 202 may be formed of a metal, and the nozzle or the like may be installed at the furnace port section formed of the metal.

A mass flow controller (MFC) 241a serving as a flow rate controller (a flow rate control unit) and a valve 243a serving as an opening/closing valve are installed at the first gas supply pipe 232a in sequence from an upstream side. In addition, a first inert gas supply pipe 232j is connected to the first gas supply pipe 232a at a downstream side of the valve 243a. An MFC 241j serving as a flow rate controller (a flow rate control unit) and a valve 243j serving as an opening/closing valve are installed at the first inert gas supply pipe 232j in sequence from the upstream side. In addition, the above-mentioned first nozzle 233a is connected to a tip section of the first gas supply pipe 232a. The first nozzle 233a is installed at an annular space between the inner wall of the reaction pipe 203 and the wafer 200 to stand up in a stacking direction of the wafers 200 from a lower portion to an upper portion of the inner wall of the reaction pipe 203. That is, the first nozzle 233a is installed at a region of a side of a wafer arrangement region in which the wafers 200 are arranged along the wafer arrangement region that horizontally surrounds the wafer arrangement region. The first nozzle 233a is constituted by an L-shaped long nozzle, and has a horizontal section installed to pass through a bottom sidewall of the reaction pipe 203 and a vertical section installed to stand up from one end side to the other end side of the wafer arrangement region. A gas supply hole 248a configured to supply a gas is installed at a side surface of the first nozzle 233a. The gas supply hole 248a is opened toward a center of the reaction pipe 203 so that the gas can be supplied toward the wafer 200. The plurality of gas supply holes 248a are formed from the lower portion to the upper portion of the reaction pipe 203, have the same opening area, and are formed at the same opening pitch.

An MFC 241b serving as a flow rate controller (a flow rate control unit) and a valve 243b serving as an opening/closing valve are installed at the second gas supply pipe 232b in sequence from the upstream side. In addition, a second inert gas supply pipe 232k is connected to the second gas supply pipe 232b at a downstream side of the valve 243b. An MFC 241k serving as a flow rate controller (a flow rate control unit) and a valve 243k serving as an opening/closing valve are installed at the second inert gas supply pipe 232k in sequence from the upstream side. Further, the above-mentioned second nozzle 233b is connected to a tip section of the second gas supply pipe 232b. The second nozzle 233b is installed in a buffer chamber 237b, which is a gas distribution space.

The buffer chamber 237b is installed in an annular space between the inner wall of the reaction pipe 203 and the wafer 200 from the lower portion to the upper portion of the inner wall of the reaction pipe 203 in the stacking direction of the wafers 200. That is, the buffer chamber 237b is formed at a region of the side of the wafer arrangement region along the wafer arrangement region that horizontally surrounds the wafer arrangement region. A gas supply hole 238b configured to supply a gas is installed at an end of a wall of the buffer chamber 237b near the wafer 200. The gas supply hole 238b is opened toward a center of the reaction pipe 203 so that the gas can be supplied toward the wafer 200. The plurality of gas supply holes 238b are installed from the lower portion to the upper portion of the reaction pipe 203, have the same opening area, and are formed at the same opening pitch.

The second nozzle 233b is installed at an end of the buffer chamber 237b opposite to the end at which the gas supply hole 238b is formed, from the lower portion to the upper portion of the inner wall of the reaction pipe 203 to stand up in the stacking direction of the wafers 200. That is, the second nozzle 233b is installed at a region of the side of the wafer arrangement region along the wafer arrangement region that horizontally surrounds the wafer arrangement region. The second nozzle 233b is constituted by an L-shaped long nozzle, and has a horizontal section installed to pass through the bottom sidewall of the reaction pipe 203 and a vertical section installed to stand up from the one side to the other side of at least the wafer arrangement region. A gas supply hole 248b configured to supply a gas is formed in a side surface of the second nozzle 233b. The gas supply hole 248b is opened toward a center of the buffer chamber 237b. The plurality of gas supply holes 248b are formed from the lower portion to the upper portion of the reaction pipe 203, like the gas supply hole 238b of the buffer chamber 237b. While the plurality of gas supply holes 248b may have the same opening area at the same opening pitch from an upstream side (the lower portion) to a downstream side (the upper portion) when a pressure difference between the inside of the buffer chamber 237b and the inside of the processing chamber 201 is small, if the pressure difference is large, the opening area may be increased or the opening pitch may be decreased from the upstream side toward the downstream side.

In the embodiment, while a difference between flow velocities from the gas supply holes 248b occurs when the opening area or the opening pitch of the gas supply hole 248b of the second nozzle 233b in the embodiment is adjusted from the upstream side to the downstream side, a gas having substantially the same flow rate is ejected. In addition, the gas ejected from each of the gas supply holes 248b is first introduced into the buffer chamber 237b, and then a difference in flow velocities of the gas in the buffer chamber 237b is uniformized. That is, the gas ejected into the buffer chamber 237b from each of the gas supply holes 248b of the second nozzle 233b is reduced in a particle speed in the buffer chamber 237b, and then ejected into the processing chamber 201 from the gas supply hole 238b of the buffer chamber 237b. Accordingly, the gas ejected into the buffer chamber 237b from each of the gas supply holes 248b of the second nozzle 233b becomes a gas having a uniform flow rate and flow velocity when the gas is ejected into the processing chamber 201 from each of the gas supply holes 238b of the buffer chamber 237b.

An MFC 241c serving as a flow rate controller (a flow rate control unit) and a valve 243c serving as an opening/closing valve are installed at the third gas supply pipe 232c in sequence from the upstream side. In addition, a third inert gas supply pipe 232l is connected to the third gas supply pipe 232c at a downstream side of the valve 243c. An MFC 241l serving as a flow rate controller (a flow rate control unit) and a valve 243l serving as an opening/closing valve are installed at the third inert gas supply pipe 232l in sequence from the upstream side. The above-mentioned third nozzle 233c is connected to a tip section of the third gas supply pipe 232c. The third nozzle 233c is installed in a buffer chamber 237c, which is a gas distribution space.

The buffer chamber 237c is installed in an annular space between the inner wall of the reaction pipe 203 and the wafer 200 from the lower portion to the upper portion of the inner wall of the reaction pipe 203 in the stacking direction of the wafers 200. That is, the buffer chamber 237c is installed at a region of the side of the wafer arrangement region along the wafer arrangement region that horizontally surrounds the wafer arrangement region. A gas supply hole 238c configured to supply a gas is installed at an end of a wall of the buffer chamber 237c near the wafer 200. The gas supply hole 238c is opened toward a center of the reaction pipe 203 so that the gas can be supplied toward the wafer 200. The plurality of gas supply holes 238c are installed from the lower portion to the upper portion of the reaction pipe 203, have the same opening area, and are formed at the same opening pitch.

The third nozzle 233c is installed at an end of the buffer chamber 237c opposite to the end at which the gas supply hole 238c is formed, from the lower portion to the upper portion of the inner wall of the reaction pipe 203 to stand up in the stacking direction of the wafers 200. That is, the third nozzle 233c is installed at a region of the side of the wafer arrangement region along the wafer arrangement region that horizontally surrounds the wafer arrangement region. The third nozzle 233c is constituted by an L-shaped long nozzle, and has a horizontal section installed to pass through the bottom sidewall of the reaction pipe 203 and a vertical section configured to stand up from one end side toward the other end side of at least the wafer arrangement region. A gas supply hole 248c configured to supply a gas is installed in a side surface of the third nozzle 233c. The gas supply hole 248c is opened toward a center of the buffer chamber 237c. The plurality of gas supply holes 248c are formed from the lower portion to the upper portion of the reaction pipe 203, like the gas supply holes 238c of the buffer chamber 237c. While the plurality of gas supply holes 248c have the same opening area at the same opening pitch from the upstream side (the lower portion) to the downstream side (the upper portion) when a pressure difference between the inside of the buffer chamber 237c and the inside of the processing chamber 201 is small, if the pressure difference is large, the opening area may be increased or the opening pitch may be decreased from the upstream side toward the downstream side.

While a difference between flow velocities from the gas supply holes 248c occurs when the opening area or the opening pitch of each of the gas supply holes 248c of the third nozzle 233c in the embodiment is adjusted from the upstream side toward the downstream side, a gas having substantially the same flow rate is ejected. In addition, the gas ejected from each of the gas supply holes 248c is first introduced into the buffer chamber 237c, and then a difference in flow velocities of the gases in the buffer chamber 237c is uniformized. That is, the gas ejected into the buffer chamber 237c from each of the gas supply holes 248c of the third nozzle 233c is reduced in a particle speed of each gas in the buffer chamber 237c, and then ejected into the processing chamber 201 from the gas supply hole 238c of the buffer chamber 237c. Accordingly, the gas ejected into the buffer chamber 237c from each of the gas supply holes 248c of the third nozzle 233c becomes a gas having a uniform flow rate and flow velocity when the gas is ejected into the processing chamber 201 from each of the gas supply holes 238c of the buffer chamber 237c.

In the gas supply method in the embodiment, the gas is conveyed via the inner wall of the reaction pipe 203, the nozzles 233a, 233b and 233c disposed in a longitudinal annular shape defined as an end of the plurality of wafers 200, and the buffer chambers 237b and 237c, and first ejected into the reaction pipe 203 near the wafer 200 from the gas supply holes 248a, 248b, 248c, 238b and 238c opened at the nozzles 233a, 233b and 233c and the buffer chambers 237b and 237c, and a direction of a main stream of the gas in the reaction pipe 203 is parallel to a surface of the wafer 200, i.e., is a horizontal direction. According to the above-mentioned configuration, the gas can be uniformly supplied to the wafer 200, and a film thickness of a thin film formed on each wafer 200 can be uniformized. In addition, while the remaining gas after the reaction slows in a direction of the exhaust pipe 231 (to be described below), a flow direction of the remaining gas is not limited to a vertical direction but appropriately specified by a position of the exhaust port.

Figure 2:
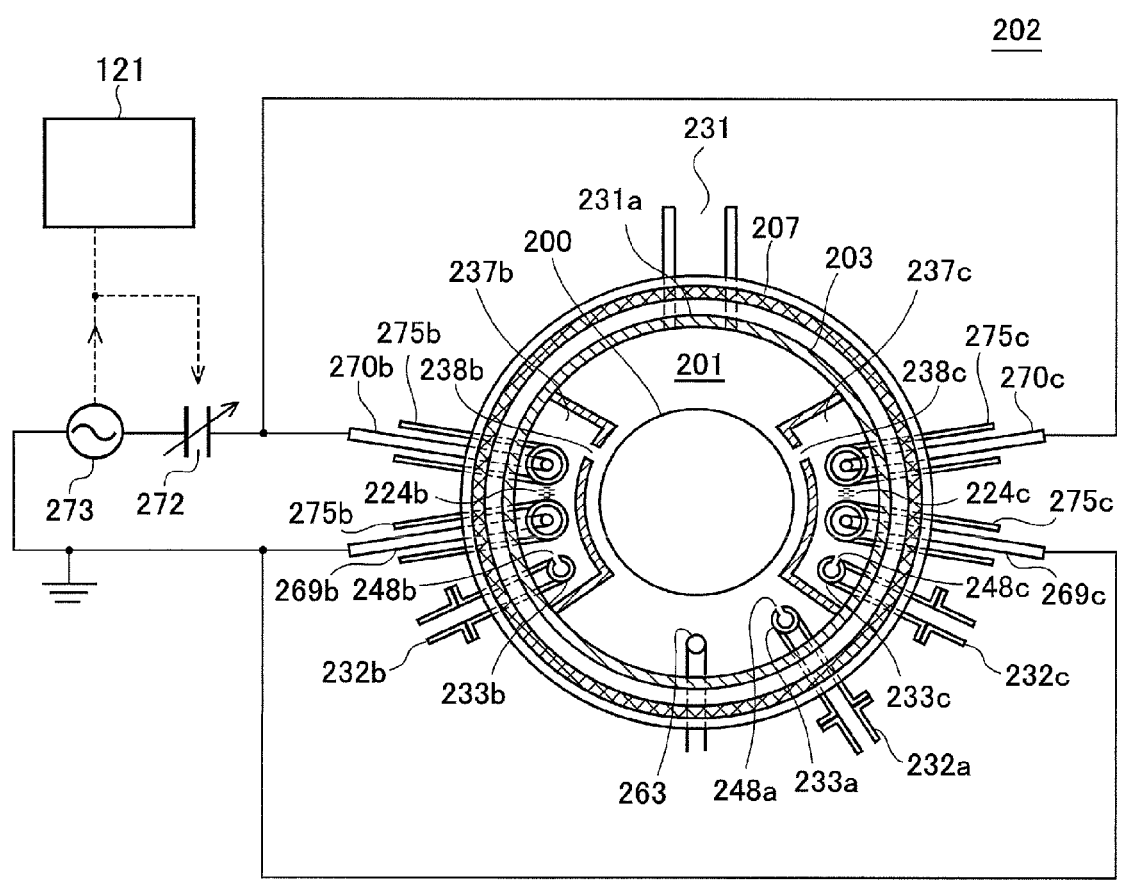
FIG. 2 is a schematic configuration view of the vertical type processing furnace of the substrate processing apparatus preferably used in the embodiment of the present invention, showing a cross-sectional view of the processing furnace section taken along line A-A of FIG. 1.

In addition, the two buffer chambers 237b and 237c are disposed to be opposite to each other to sandwich a center of the wafer 200 (i.e., a center of the reaction pipe 203. Specifically, as shown in FIG. 2, the two buffer chambers 237b and 237c are disposed to be line-symmetrical to each other with reference to a straight line connecting a center of the wafer 200 and a center of an exhaust port 231a (to be described below) installed at a sidewall of the reaction pipe 203 when seen in a plan view. In addition, the gas supply hole 238b of the buffer chamber 237b, the gas supply hole 238c of the buffer chamber 237c and the exhaust port 231a are disposed such that straight lines connecting the centers form an isosceles triangle. Accordingly, a gas flow flowing from the two buffer chambers 237b and 237c to the wafer 200 is uniformized. That is, gas flows flowing from the two buffer chambers 237b and 237c to the wafer 200 are line-symmetrical to each other with reference to a straight line connecting the center of the wafer 200 and the center of the exhaust port 231a.

A source gas containing a predetermined element, chlorine (Cl) and oxygen (O) and having a chemical bond (Si—O bonding) of the predetermined element and oxygen, for example, a siloxane such as hexachlorodisiloxane ($Si_2Cl_6O$, abbreviation: HCDS) gas, which is a siloxane-based source gas (siloxane-containing gas) containing silicon (Si), Cl and O serving as predetermined element and having Si—O bonding, is supplied from the first gas supply pipe 232a into the processing chamber 201 via the MFC 241a, the valve 243a and the first nozzle 233a. At the same time, an inert gas may be supplied from the first inert gas supply pipe 232j into the first gas supply pipe 232a via the MFC 241j and the valve 243j.

Here, a siloxane is compound mainly containing Si and O, and is a general name for compounds having Si—O—Si bonding (siloxane bonding).

A reactive gas containing at least one element selected from a group consisting of nitrogen (N), carbon (C) and boron (B), for example, a gas containing nitrogen (nitrogen-containing gas), i.e., a nitriding gas such as ammonia ($NH_3$) gas, is supplied from the second gas supply pipe 232b into the processing chamber 201 via the MFC 241b, the valve 243b, the second nozzle 233b and the buffer chamber 237b. At the same time, an inert gas may be supplied from the second inert gas supply pipe 232k into the second gas supply pipe 232b via the MFC 241k and the valve 243k. In addition to the nitrogen-containing gas, a carbon-containing gas, a gas containing nitrogen and carbon, a boron-containing gas, a gas containing boron, nitrogen and carbon, or the like, may be used as the reactive gas. Further, an oxygen-containing gas may be used as the reactive gas.

A reactive gas containing at least one element selected from a group consisting of nitrogen (N), carbon (C) and boron (B), for example, a gas containing nitrogen (a nitrogen-containing gas), i.e., a nitriding gas such as ammonia ($NH_3$) gas, is supplied from the third gas supply pipe 232c into the processing chamber 201 via the MFC 241c, the valve 243c, the third nozzle 233c and the buffer chamber 237c. At the same time, an inert gas may be supplied from the third inert gas supply pipe 232l into the third gas supply pipe 232c via the MFC 241l and the valve 243l. In addition to the nitrogen-containing gas, a carbon-containing gas, a gas containing nitrogen and carbon, a boron-containing gas, a gas containing boron, nitrogen and carbon, or the like, may be used as the reactive gas. Further, an oxygen-containing gas may be used as the reactive gas.

When the gas flows from the first gas supply pipe 232a as described above, a first gas supply system (a source gas supply system) configured to supply a source gas ($Si_2Cl_6O$ gas) to the wafer 200 in the processing chamber 201, i.e., a siloxane-based source gas supply system (a $Si_2Cl_6O$ gas supply system), is mainly constituted by the first gas supply pipe 232a, the MFC 241a and the valve 243a. The first gas supply system may be referred to as a siloxane-containing gas supply system. In addition, the first nozzle 233a may be included in the first gas supply system. Further, the first inert gas supply system is mainly constituted by the first inert gas supply pipe 232j, the MFC 241j and the valve 243j. The first inert gas supply system also functions as a purge gas supply system.

When the gas flows from the second gas supply pipe 232b and the third gas supply pipe 232c, a second gas supply system (a nitriding gas supply system) configured to supply a nitriding gas ($NH_3$ gas) to the wafer 200 in the processing chamber 201, i.e., a nitrogen-containing gas supply system (an $NH_3$ gas supply system), is mainly constituted by the second gas supply pipe 232b, the third gas supply pipe 232c, the MFCs 241b and 241c, and the valves 243b and 243c. In addition, the second nozzle 233b, the third nozzle 233c and the buffer chambers 237b and 237c may be included in the second gas supply system. Further, a second inert gas supply system is mainly constituted by the second inert gas supply pipe 232k, the third inert gas supply pipe 232l, the MFCs 241k and 241l, and the valves 243k and 243l. The second inert gas supply system also functions as the purge gas supply system. The second gas supply system may be referred to as a reactive gas supply system. In addition to the nitrogen-containing gas, as described above, the carbon-containing gas, the gas containing nitrogen and carbon, the boron-containing gas, the gas containing boron, nitrogen and carbon, and the oxygen-containing gas may be supplied from the second gas supply system (the reactive gas supply system), and in this case, the second gas supply system is configured as a carbon-containing gas supply system, a nitrogen- and carbon-containing gas supply system, a boron-containing gas supply system, a boron-, nitrogen- and carbon-containing gas supply system, or an oxygen-containing gas supply system.

As shown in FIG. 2, a first rod-shaped electrode 269b serving as a first electrode having a long and thin structure and a second rod-shaped electrode 270b serving as a second electrode are disposed in the buffer chamber 237b from the lower portion to the upper portion of the reaction pipe 203 in the stacking direction of the wafers 200. Each of the first rod-shaped electrode 269b and the second rod-shaped electrode 270b is installed parallel to the second nozzle 233b. Each of the first rod-shaped electrode 269b and the second rod-shaped electrode 270b is protected by coating with an electrode protection pipe 275b configured to protect each electrode from the upper portion to the lower portion. One of the first rod-shaped electrode 269b and the second rod-shaped electrode 270b is connected to a high frequency power supply 273 via the matching device 272, and the other is connected to an earth serving as a reference potential. As high frequency power is applied between the first rod-shaped electrode 269b and the second rod-shaped electrode 270b from the high frequency power supply 273 via a matching device 272, plasma is generated from a plasma generating region 224b between the first rod-shaped electrode 269b and the second rod-shaped electrode 270b.

Similarly, a first rod-shaped electrode 269c serving as a first electrode having a long and thin structure and a second rod-shaped electrode 270c serving as a second electrode are installed in the buffer chamber 237c from the lower portion to the upper portion of the reaction pipe 203 in the stacking direction of the wafers 200. Each of the first rod-shaped electrode 269c and the second rod-shaped electrode 270c is installed parallel to the third nozzle 233c. Each of the first rod-shaped electrode 269c and the second rod-shaped electrode 270c is protected by coating with an electrode protection pipe 275c serving as a protection pipe configured to protect each electrode from the upper portion to the lower portion. One of the first rod-shaped electrode 269c and the second rod-shaped electrode 270c is connected to the high frequency power supply 273 via the matching device 272, and the other is connected to an earth serving as a reference potential. As high frequency power is applied between the first rod-shaped electrode 269c and the second rod-shaped electrode 270c from the high frequency power supply 273 via the matching device 272, plasma is generated from a plasma generating region 224c between the first rod-shaped electrode 269c and the second rod-shaped electrode 270c.

A first plasma source serving as a plasma generator (a plasma generating unit) is mainly constituted by the first rod-shaped electrode 269b, the second rod-shaped electrode 270b and the electrode protection pipe 275b. In addition, the matching device 272 and the high frequency power supply 273 may be included in the first plasma source. Further, a second plasma source serving as a plasma generator (a plasma generating unit) is mainly constituted by the first rod-shaped electrode 269c, the second rod-shaped electrode 270c and the electrode protection pipe 275c. In addition, the matching device 272 and the high frequency power supply 273 may be included in the second plasma source. The first plasma source and the second plasma source may function as an activation mechanism (an excitation unit) configured to activate (excite) the gas with plasma. As described above, the plurality of (herein, two) excitation units are installed at the substrate processing apparatus of the embodiment. In addition, the plurality of excitation units are disposed in a distributed manner like the buffer chambers 237b and 237c.

The electrode protection pipes 275b and 275c are configured to be inserted into the buffer chambers 237b and 237c in a state in which each of the first rod-shaped electrodes 269b and 269c) and the second rod-shaped electrodes 270b and 270c is isolated from the atmosphere of the buffer chambers 237b and 237c. Here, when an oxygen concentration in the electrode protection pipes 275b and 275c is the same oxygen concentration of external air (atmospheric air), the first rod-shaped electrodes 269b and 269c and the second rod-shaped electrodes 270b and 270c inserted into the electrode protection pipes 275b and 275c are oxidized by heat due to the heater 207. For this reason, as an inert gas such as nitrogen gas or the like is filled in the electrode protection pipes 275b and 275c or the insides of the electrode protection pipes 275b and 275c are purged by an inert gas such as nitrogen gas or the like using an inert gas purge mechanism, the oxygen concentration in the electrode protection pipes 275b and 275c can be reduced to prevent oxidation of the first rod-shaped electrodes 269b and 269c or the second rod-shaped electrodes 270b and 270c.

The above-mentioned exhaust port 231a is installed at the reaction pipe 203. The exhaust pipe 231 configured to exhaust the atmosphere in the processing chamber 201 is connected to the exhaust port 231a. A vacuum pump 246 serving as a vacuum exhaust apparatus is connected to the exhaust pipe 231 via a pressure sensor 245 serving as a pressure detector (a pressure detection unit) configured to detect a pressure in the processing chamber 201 and an automatic pressure controller (APC) valve 244 serving as a pressure regulator (a pressure regulation unit). In addition, the APC valve 244 is a valve configured to perform vacuum exhaust and stoppage of the vacuum exhaust in the processing chamber 201 by opening and closing the valve in a state in which the vacuum pump 246 is operated, and configured to adjust a pressure in the processing chamber 201 by adjusting a valve opening angle when the vacuum pump 246 is operated. An exhaust system is mainly constituted by the exhaust pipe 231, the APC valve 244 and the pressure sensor 245. In addition, the vacuum pump 246 may be included in the exhaust system. The exhaust system is configured to vacuum-exhaust the pressure in the processing chamber 201 to a predetermined pressure (a vacuum level) by adjusting the valve opening angle of the APC valve 244 based on pressure information detected by the pressure sensor 245 while operating the vacuum pump 246.

A seal cap 219 serving as a furnace port lid configured to hermetically seal a lower end opening of the reaction pipe 203 is installed at a lower side of the reaction pipe 203. The seal cap 219 is configured to abut a lower end of the reaction pipe 203 from a lower side in a vertical direction. The seal cap 219 is formed of a metal such as stainless steel or the like, and formed in a disk shape. An O-ring 220 serving as a seal member configured to abut the lower end of the reaction pipe 203 is installed at an upper surface of the seal cap 219. A rotary mechanism 267 configured to rotate the boat 217 serving as a substrate holder (to be described below) is installed at a side of the seal cap 219 opposite to the processing chamber 201. A rotary shaft 255 of the rotary mechanism 267 passes through the seal cap 219 to be connected to the boat 217. The rotary mechanism 267 is configured to rotate the boat 217 to thereby rotate the wafer 200. The seal cap 219 is configured to be vertically elevated by a boat elevator 115 serving as an elevation mechanism vertically installed at the outside of the reaction pipe 203. The boat elevator 115 is configured to load and unload the boat 217 into/from the processing chamber 201 by elevating the seal cap 219. That is, the boat elevator 115 is configured as a conveyance apparatus (a conveyance mechanism) configured to convey the boat 217, i.e., the wafer 200, to the inside or the outside of the processing chamber 201.

The boat 217 serving as a substrate supporter is formed of a thermal resistant material such as quartz, silicon carbide, or the like, and is configured to concentrically align the plurality of wafers 200 in a horizontal posture and support the wafers 200 in a multi-stage manner. In addition, a thermal insulating member 218 formed of a thermal resistant material such as quartz, silicon carbide, or the like, is installed at a lower portion of the boat 217 and configured such that heat from the heater 207 cannot be easily transferred toward the seal cap 219. Further, the thermal insulating member 218 may be configured by a plurality of thermal insulating plates formed of a thermal resistant material such as quartz, silicon carbide, or the like, and a thermal insulating plate holder configured to support the thermal insulating plate in a horizontal posture in a multi-stage manner.

A temperature sensor 263 serving as a temperature detector is installed in the reaction pipe 203, and is configured such that temperatures in the processing chamber 201 have a desired temperature distribution by adjusting an electrical connecting state to the heater 207 based on temperature information detected by the temperature sensor 263. The temperature sensor 263 is formed in an L shape like the first nozzle 233a and installed along the inner wall of the reaction pipe 203.

Figure 3:
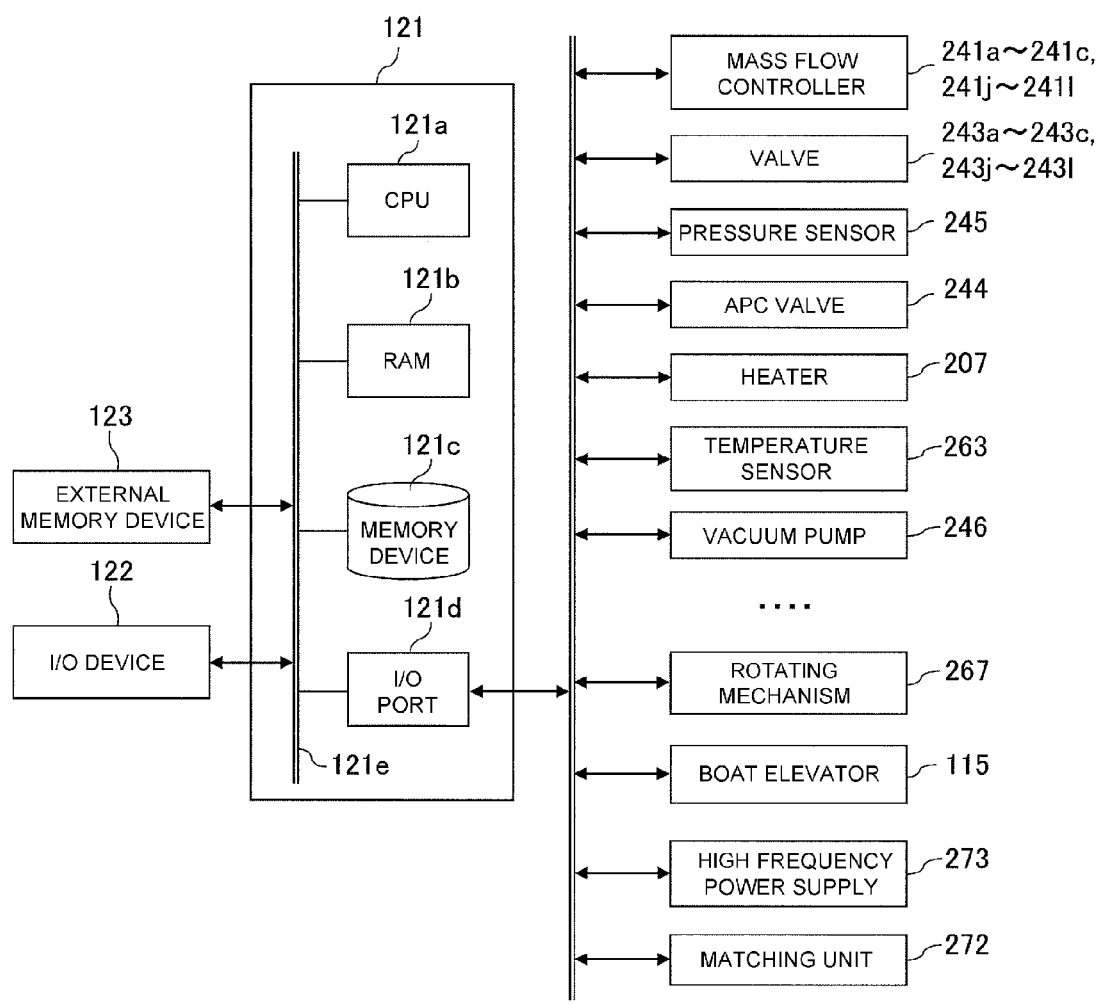
FIG. 3 is a schematic configuration view of a controller of the substrate processing apparatus preferably used in the embodiment of the present invention, showing a block diagram of a control system of the controller.
Figure 4:
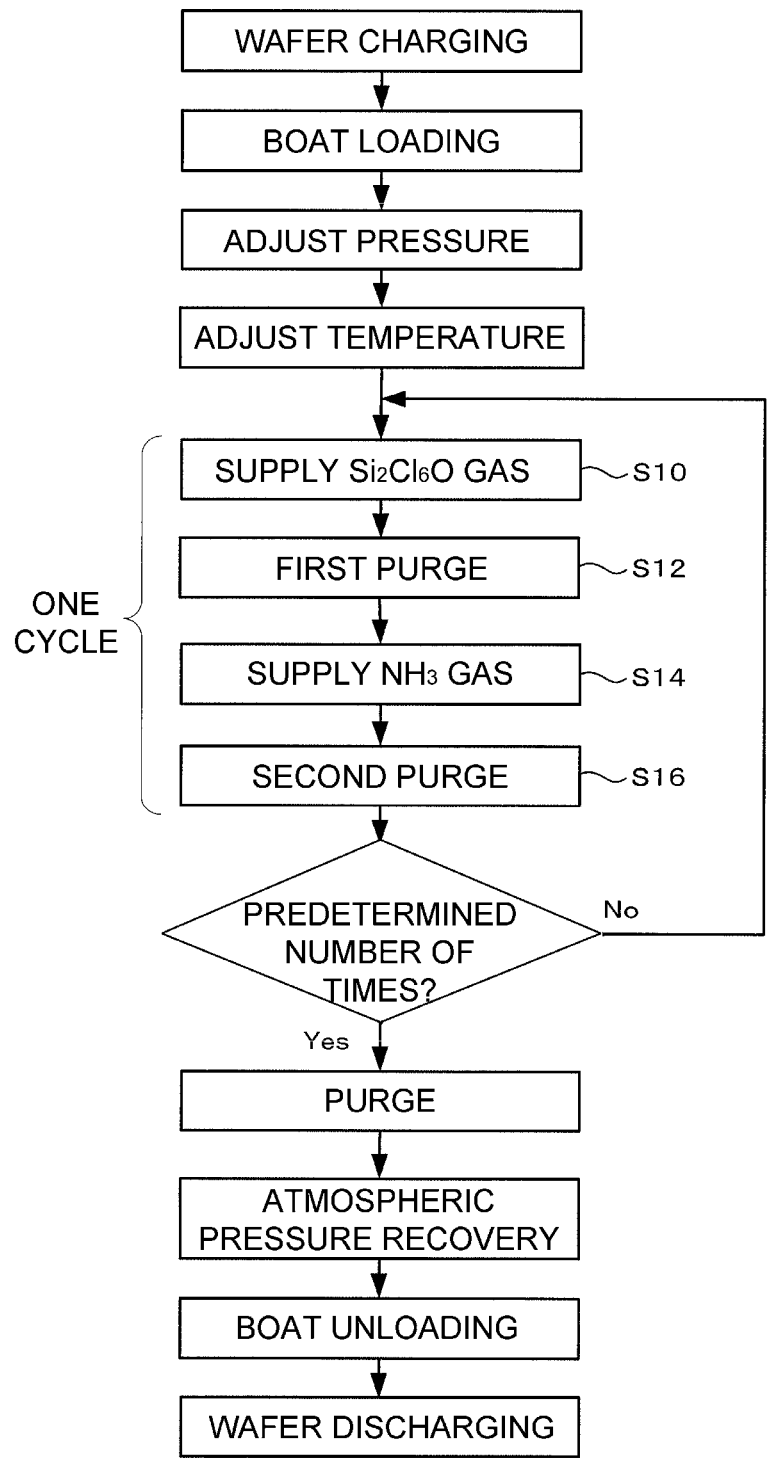
FIG. 4 is a view showing a film-forming flow according to the embodiment of the present invention.
Figure 5:
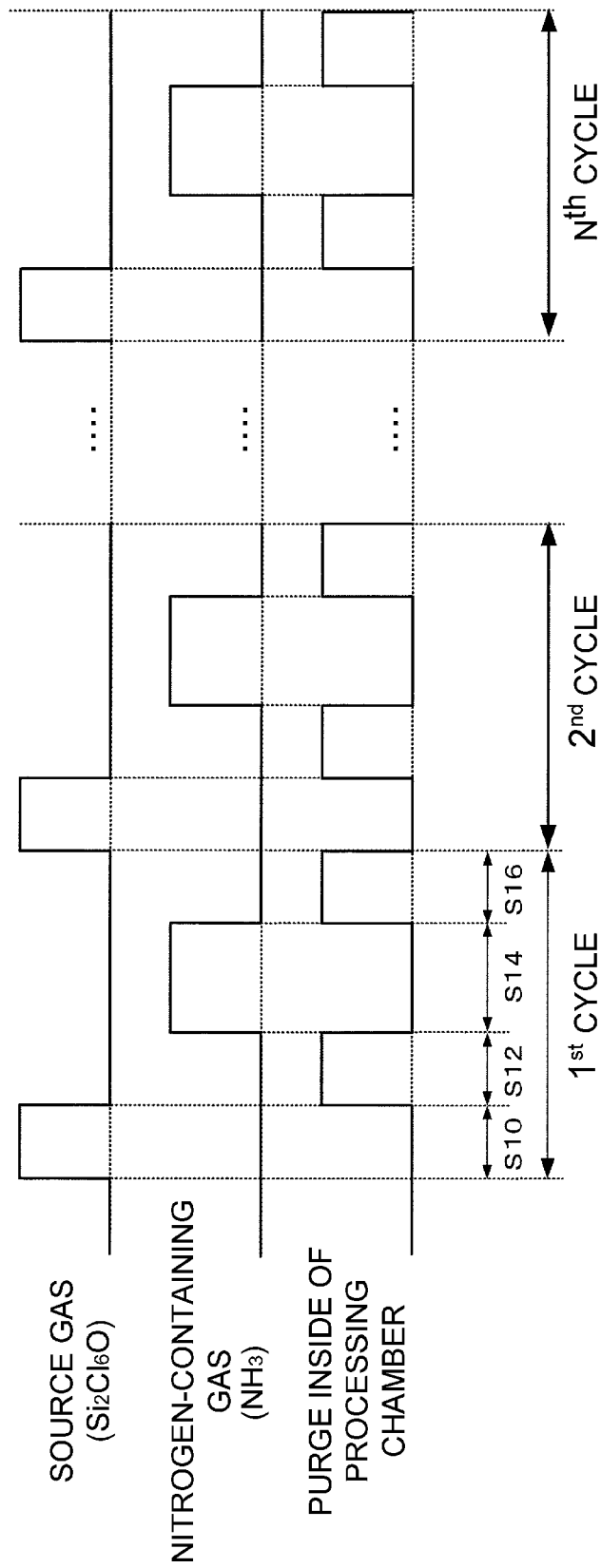
FIG. 5 is a view showing gas supply timing according to the embodiment of the present invention.

As shown in FIG. 3, a controller 121 serving as a control unit (a control means) is configured as a computer including a central processing unit (CPU) 121a, a random access memory (RAM) 121b, a storage device 121c and an I/O port 121d. The RAM 121b, the storage device 121c and the I/O port 121d are configured to exchange data with the CPU 121a via an internal bus 121e. An input/output device 122 constituted by a touch panel or the like is connected to the controller 121.

The storage device 121c is constituted by a flash memory, a hard disk drive (HDD), or the like. A control program for controlling an operation of the substrate processing apparatus, a process recipe in which a sequence, a condition, or the like of the following substrate processing is written, or the like, are readably stored in the storage device 121c. In addition, the process recipe is combined to execute each sequence of the following substrate processing process in the controller 121 to obtain a predetermined result, and functions as a program. Hereinafter, the process recipe, the control program, or the like, is generally and simply referred to as a program. In addition, when a term "program" is used herein, only the process recipe may be included, only the control program may be included, or both may be included. Further, the RAM 121b is configured as a memory region (work area) in which the program, data, or the like, read by the CPU 121a is temporarily stored.

The I/O port 121d is connected to the MFCs 241a, 241b, 241c, 241j, 241k and 241l, the valves 243a, 243b, 243c, 243j, 243k and 243l, the pressure sensor 245, the APC valve 244, the vacuum pump 246, the heater 207, the temperature sensor 263, the rotary mechanism 267, the boat elevator 115, the high frequency power supply 273, the matching device 272, and so on.

The CPU 121a is configured to read and execute the control program from the storage device 121c and read the process recipe from the storage device 121c according to an input of a manipulation command from the input/output device 122. In addition, the CPU 121a is configured to control a flow rate regulating operation of various kinds of gases by MFCs 241a, 241b, 241c, 241j, 241k and 241l according to contents of the read process recipe, opening/closing operations of the valves 243a, 243b, 243c, 243j, 243k and 243l, opening/closing operations of the APC valve 244, a pressure regulating operation by the APC valve 244 based on the pressure sensor 245, a temperature regulating operation of the heater 207 based on the temperature sensor 263, starting and stoppage of the vacuum pump 246, a rotation and rotational speed adjusting operation of the boat 217 by the rotary mechanism 267, an elevating operation of the boat 217 by the boat elevator 115, power supply of the high frequency power supply 273, an impedance regulating operation by the matching device 272, and so on.

In addition, the controller 121 is not limited to an exclusive computer but may be constituted by a general computer. For example, the controller 121 according to the embodiment may be constituted by preparing an external storage device 123 in which the above-mentioned program is stored (for example, a magnetic tape, a magnetic disk such as a flexible disk, a hard disk, or the like, an optical disc such as a CD, a DVD, or the like, an optical magnetic disc such as an MO, or a semiconductor memory such as a USB memory, a memory card, or the like), and installing the program in the general computer using the above-mentioned external storage device 123. Further, a unit configured to supply a program to the computer is not limited to the case in which the program is supplied via the external storage device 123. For example, the program may be supplied using a communication means such as the Internet or an exclusive line without the external storage device 123. In addition, the storage device 121c or the external storage device 123 is constituted by a non-transitory computer-readable recording medium. Hereinafter, these are generally and simply referred to as non-transitory computer-readable recording media. Further, the term "non-transitory computer-readable recording medium" used in the description may include only the storage device 121c, only the external storage device 123, or both of these.

(2) Substrate Processing Process

Next, an example of a method of forming a nitride film or an oxynitride film serving as an insulating film on a substrate will be described as one process among manufacturing processes of a semiconductor device using a processing furnace of the above-mentioned substrate processing apparatus. In addition, in the following description, operations of the respective parts constituting the substrate processing apparatus are controlled by the controller 121.

In a film-forming sequence of the embodiment, a silicon nitride film (a SiN film) or a silicon oxynitride film (a SiON film) serving as an insulating film is formed on the wafer 200 by alternately performing a process of supplying $Si_2Cl_6O$ gas to the wafer 200 accommodated in the processing chamber 201 using $Si_2Cl_6O$ gas serving as a source gas and $NH_3$ gas serving as a nitrogen-containing gas (a $Si_2Cl_6O$ gas supply process) and a process of supplying plasma-excited $NH_3$ gas to the wafer 200 in the processing chamber 201 (an $NH_3$ gas supply process) a predetermined number of times. Here, using $N_2$ gas serving as a purge gas, a process of purging the inside of the processing chamber 201 using the $N_2$ gas after $Si_2Cl_6O$ gas is supplied (a first purge process) is performed, and then a process of purging the inside of the processing chamber 201 using the $N_2$ gas after the $NH_3$ gas is supplied (a second purge process) is performed.

That is, in the film-forming sequence of the embodiment, a silicon nitride film or a silicon oxynitride film is formed on the wafer 200 by performing a cycle a predetermined number of times, the cycle including a process of supplying $Si_2Cl_6O$ gas to the wafer 200 in the processing chamber 201 (a $Si_2Cl_6O$ gas supply process), a process of purging the inside of the processing chamber 201 (a first purge process), a process of supplying plasma-excited $NH_3$ gas to the wafer 200 in the processing chamber 201 (an $NH_3$ gas supply process), and a process of purging the inside of the processing chamber 201 (a second purge process). Hereinafter, the film-forming sequence of the embodiment will be described in detail.

In addition, the term "wafer" used in the description may include only "the wafer itself," or "a stacked body (a collected body) of the wafer and a predetermined layer or film formed on a surface thereof, i.e., the wafer including a predetermined layer of film formed on a surface thereof." In addition, the term "a surface of a wafer" used in the description may include "a surface of the wafer itself (an exposed surface)," or "a surface of a predetermined layer or film formed on the wafer, i.e., the outermost surface of the wafer, which is a stacked body."

Accordingly, the phrase "a predetermined gas is supplied to a wafer" used in the description may mean that "a predetermined gas is directly supplied to a surface of the wafer itself (an exposed surface)," or that "a predetermined gas is supplied to a layer or a film formed on the wafer, i.e., the outermost surface of the wafer, which is a stacked body." In addition, the phrase "a predetermined layer (or film) is formed on a wafer" used in the description may mean that "a predetermined layer (or film) is directly formed on a surface of the wafer itself (an exposed surface)," or that "a predetermined layer (or film) is formed on a layer or a film formed on the wafer, i.e., the outermost surface of the wafer, which is a stacked body."

In addition, the term "substrate" used in the description is similar to the term "wafer," and thus "wafer" and "substrate" may be used synonymously in the description.

(Wafer Charging and Boat Loading)

When the plurality of wafers 200 are charged in the boat 217 (wafer charging), as shown in FIG. 1, the boat 217 supporting the plurality of wafers 200 is raised by the boat elevator 115 to be loaded into the processing chamber 201 (boat loading). In this state, the seal cap 219 seals the lower end of the reaction pipe 203 via the O-ring 220.

(Pressure Regulating and Temperature Regulating)

The inside of the processing chamber 201 is vacuum-exhausted by the vacuum pump 246 to a desired pressure (a vacuum level). Here, the pressure in the processing chamber 201 is measured by the pressure sensor 245, and the APC valve 244 is feedback-controlled based on the measured pressure information (pressure regulating). In addition, the vacuum pump 246 maintains an always-operating state at least until the processing of the wafer 200 is terminated. Further, the inside of the processing chamber 201 is heated by the heater 207 to a desired temperature. Here, an electrical connection state to the heater 207 is feedback-controlled based on the temperature information detected by the temperature sensor 263 such that the inside of the processing chamber 201 reaches a desired temperature distribution (temperature regulating). In addition, heating of the inside of the processing chamber 201 by the heater 207 is continuously performed at least until the processing of the wafer 200 is terminated. Next, rotation of the boat 217 and the wafer 200 is started by the rotary mechanism 267 (wafer rotation). In addition, rotation of the boat 217 and the wafer 200 by the rotary mechanism 267 is continuously performed at least until the processing of the wafer 200 is terminated. Next, the following four steps are sequentially performed.

(Step S10)

The valve 243a of the first gas supply pipe 232a and the valve 243j of the first inert gas supply pipe 232j are opened to flow $Si_2Cl_6O$ gas to the first gas supply pipe 232a and $N_2$ gas to the first inert gas supply pipe 232j. The $Si_2Cl_6O$ gas flows from the first gas supply pipe 232a to be flow-rate-controlled by the MFC 241a. The $N_2$ gas flows from the first inert gas supply pipe 232j to be flow-rate-controlled by the MFC 241j. The flow-rate-controlled $Si_2Cl_6O$ gas is mixed with the flow-rate-controlled $N_2$ gas in the first gas supply pipe 232a to be supplied from the gas supply hole 248a of the first nozzle 233a into the heated processing chamber 201, a pressure in which is reduced, and exhausted from the exhaust pipe 231. Here, the $Si_2Cl_6O$ gas is supplied to the wafer 200 (a $Si_2Cl_6O$ gas supply process)

Here, in order to prevent invasion of the $Si_2Cl_6O$ gas into the buffer chambers 237b and 237c, the second nozzle 233b or the third nozzle 233c, the valves 243k and 243l are opened to cause the $N_2$ gas to flow through the second inert gas supply pipe 232k and the third inert gas supply pipe 232l.

The $N_2$ gas is supplied into the processing chamber 201 to be exhausted through the exhaust pipe 231 via the second gas supply pipe 232b, the third gas supply pipe 232c, the second nozzle 233b, the third nozzle 233c, and the buffer chambers 237b and 237c.

Here, the APC valve 244 is appropriately adjusted such that the pressure in the processing chamber 201 is maintained within a range of less than atmospheric pressure, for example, 10 to 1,000 Pa. A supply flow rate of the $Si_2Cl_6O$ gas controlled by the MFC 241a is a flow rate within a range of, for example, 100 to 2,000 sccm (0.1 to 2 slm). Each supply flow rate of the $N_2$ gas controlled by the MFCs 241j, 241k and 241l is a flow rate within a range of, for example, 100 to 10,000 sccm (0.1 to 10 slm). A time in which the $Si_2Cl_6O$ gas is supplied to the wafer 200, i.e., a gas supply time (an exposure time), is a time within a range of, for example, 1 to 120 seconds. A temperature of the heater 207 is set such that a chemical vapor deposition reaction occurs in the processing chamber 201 within the above-mentioned pressure range. That is, the temperature of the heater 207 is set such that the temperature of the wafer 200 is maintained at a uniform temperature within a range of, for example, 350 to 950° C., preferably 600 to 900° C., and more preferably 700 to 900° C.

In addition, when the temperature of the wafer 200 is less than 350° C., $Si_2Cl_6O$ cannot be easily decomposed and adsorbed on the wafer 200. This problem can be solved by increasing the temperature of the wafer to 200 to 350° C. or more. In addition, when the temperature of the wafer 200 exceeds 900° C. or 950° C., a gaseous phase reaction is excessively strengthened and film thickness uniformity is easily deteriorated. This problem can be solved by decreasing the temperature of the wafer 200 to 950° C. or less, preferably 900° C. or less.

Further, when the temperature of the wafer 200 is less than 600° C., the film can be formed, but a practical film-forming rate may not be obtained. The practical film-forming rate can be obtained by increasing the temperature of the wafer 200 to 600° C. or more.

Furthermore, when the temperature of the wafer 200 is less than 700° C., the hydrogen incorporated in the film is likely to remain, and a low density film having a large number of adsorption sites of hydrogen (a large number of defects) may be formed. This problem can be solved by increasing the temperature of the wafer 200 to 700° C. or more.

Accordingly, the temperature of the wafer 200 may be 350 to 950° C., preferably 600 to 900° C., and more preferably 700 to 900° C.

In addition, when the temperature of the wafer 200 is within a range of 700 to 900° C., the hydrogen incorporated in the film cannot easily remain (is likely to be separated), and a high density film having a small number of adsorption sites of hydrogen (a small number of defects) can be formed. That is, the film in which a hydrogen concentration in the film within the temperature range is extremely low and film thickness uniformity is extremely good can be formed. In addition, since the $Si_2Cl_6O$ gas has a low decomposition property (a low reaction property) and a high pyrolysis temperature, even when the film is formed at a relatively high temperature such as 700 to 900° C., generation of an excessive gaseous reaction can be suppressed, and thus generation of particles can be suppressed.

A layer including silicon and oxygen and having a thickness of, for example, less than one atomic layer to several atomic layers is formed on the wafer 200 (a base film on the surface) by supplying the $Si_2Cl_6O$ gas into the processing chamber 201 under the above-mentioned condition, i.e., the condition in which the chemical vapor deposition reaction is generated. The layer including silicon and oxygen is a layer having Si—O bonding, and may include an adsorption layer of the $Si_2Cl_6O$ gas, a silicon oxide layer (a SiO layer), or both of these. However, the layer including silicon and oxygen may be a layer including silicon (Si), oxygen (O) and chlorine (Cl). In addition, the layer including silicon and oxygen may be simply referred to as an oxide layer or may be referred to as an oxide layer including silicon or a silicon oxide layer. In addition, the layer including silicon (Si), oxygen (O) and chlorine (Cl) may be referred to as an oxide layer including silicon and chlorine or a silicon oxide layer including chlorine.

Here, the silicon oxide layer (the SiO layer) is a general name including a discontinuous layer, in addition to a continuous layer composed of Si and O, or a silicon oxide film (a SiO film) formed by overlapping them. In addition, the continuous layer composed of Si and O may be referred to as the SiO film. Further, Si composing the SiO layer includes Cl bonds that are not completely broken.

In addition, the adsorption layer of the $Si_2Cl_6O$ gas includes a discontinuous chemisorption layer, in addition to a continuous chemical adsorption layer of gas molecules of the $Si_2Cl_6O$ gas. That is, the adsorption layer of the $Si_2Cl_6O$ gas includes a chemisorption layer having a thickness of one molecular layer or less than the one molecular layer composed of $Si_2Cl_6O$ molecules. In addition, the $Si_2Cl_6O$ molecules composing the adsorption layer of the $Si_2Cl_6O$ gas also include Si and Cl bonds that are partially broken ($Si_xCl_yO$ molecules). That is, the adsorption layer of the $Si_2Cl_6O$ includes a continuous chemical adsorption layer or a discontinuous chemical adsorption layer of $Si_2Cl_6O$ molecules and/or $Si_xCl_yO$ molecules. In addition, the layer having a thickness of less than one atomic layer means a discontinuously formed atomic layer, and the layer having a thickness of one atomic layer means a continuously formed atomic layer. Further, the layer having a thickness of less than one molecular layer means a discontinuously formed molecular layer, and the layer having a thickness of one molecular layer means a continuously formed molecular layer.

The SiO is accumulated on the wafer 200 to form the SiO layer under the conditions in which the $Si_2Cl_6O$ gas is autolyzed (pyrolyzed), i.e., the conditions in which a pyrolysis reaction of the $Si_2Cl_6O$ is generated. The $Si_2Cl_6O$ gas is adsorbed to the wafer 200 to form the adsorption layer of the $Si_2Cl_6O$ gas under the condition in which the $Si_2Cl_6O$ gas is not autolyzed (not pyrolyzed), i.e., the condition in which the pyrolysis reaction of the $Si_2Cl_6O$ is not generated. At least a portion of the Si—O bonding in the $Si_2Cl_6O$ gas is not broken but held (maintained) under any condition, and incorporated in the layer including Si and O (in the SiO layer or the adsorption layer of the $Si_2Cl_6O$ gas) as it is. For example, even when the Si—O bonding of one side of the Si—O—Si bonding of the $Si_2Cl_6O$ is broken under the condition in which the pyrolysis reaction of the $Si_2Cl_6O$ is generated, Si—O bonding of the other side is not broken but held and incorporated into the SiO layer as it is. This is caused by the fact that the $Si_2Cl_6O$ gas has strong Si—O bonding. In addition, forming the adsorption layer of the $Si_2Cl_6O$ gas on the wafer 200 is more preferable than forming the SiO layer because the film-forming rate can be increased.

When the thickness of the layer including silicon and oxygen formed on the wafer 200 exceeds several atomic layers, a nitration action or a chlorine desorption action in step S14 (to be described below) cannot be easily transmitted to the entire layer including silicon and oxygen. In addition, a minimum value of the thickness of the layer including silicon and oxygen that can be formed on the wafer 200 is less than one atomic layer. Accordingly, the thickness of the layer including silicon and oxygen may be less than one atomic layer to several atomic layers. Further, as the thickness of the layer including silicon and oxygen is one atomic layer or less, i.e., one atomic layer or less than one atomic layer, the nitration action or the chlorine desorption action in step S14 can be relatively increased, and a time needed for the nitration action or the chlorine desorption action in step S14 can be reduced. The time needed to form the layer including silicon and oxygen in step S10 can also be reduced. Eventually, a processing time per one cycle can be reduced, and a total processing time can also be reduced. That is, the film-forming rate can also be increased. In addition, as the thickness of the layer including silicon and oxygen is one atomic layer or less, controllability of the film thickness uniformity can be increased.

In addition to hexachlorodisiloxane, an inorganic chlorosiloxane compound such as tetrachlorodisiloxane, pentachlorodisiloxane, octachlorotrisiloxane, decachlorotetrasiloxane, dodecachloropentasiloxane, and so on, may be used as a source including Si, Cl and O and having Si—O bonding, i.e., a siloxane-based source material. An organic chlorosiloxane compound may also be used as the siloxane-based source material. Further, in addition to the $N_2$ gas, a rare gas such as Ar, He, Ne, Xe, or the like may be used as the inert gas.

(Step S12)

After the layer including silicon and oxygen is formed on the wafer 200, the valve 243a of the first gas supply pipe 232a is closed to stop supply of the $Si_2Cl_6O$ gas. Here, the APC valve 244 of the exhaust pipe 231 is opened to vacuum-exhaust the inside of the processing chamber 201 by the vacuum pump 246, and discharge the $Si_2Cl_6O$ gas after non-reaction or contribution to formation of the layer including silicon and oxygen remaining in the processing chamber 201 from the inside of the processing chamber 201. In addition, the valves 243j, 243k and 243l can be opened to maintain supply of the $N_2$ gas serving as the inert gas into the processing chamber 201. The $N_2$ gas acts as a purge gas, and thus can further increase an effect of discharging the $Si_2Cl_6O$ gas after non-reaction or contribution to formation of the layer including silicon and oxygen remaining in the processing chamber 201 from the inside of the processing chamber 201 (a first purge process).

In addition, here, the gas remaining in the processing chamber 201 may not be completely discharged, and the inside of the processing chamber 201 may not be completely purged. When the gas remaining in the processing chamber 201 is minute, there is no bad influence caused in step S14 performed thereafter. Here, a flow rate of the $N_2$ gas supplied into the processing chamber 201 need not be a large flow rate, and for example, substantially the same amount of gas as a volume of the reaction pipe 203 (the processing chamber 201) may be supplied to perform the purge such that there is no bad influence generated in step S14. As described above, as the inside of the processing chamber 201 is not completely purged, a purge time can be reduced to improve throughput. In addition, consumption of the $N_2$ gas can be suppressed to a necessary minimum value.

Here, the temperature of the heater 207 is set such that the temperature of the wafer 200 is uniform within a range of 350 to 950° C., preferably 600 to 900° C., and more particularly 700 to 900° C., as in supply of the $Si_2Cl_6O$ gas.

A supply flow rate of the N₂ gas serving as the purge gas supplied from each of the inert gas supply systems is a flow rate within a range of, for example, 100 to 10,000 sccm (0.1 to 10 slm). In addition to the N₂ gas, a rare gas such as Ar, He, Ne, Xe, or the like may be used as the purge gas.

(Step S14)

After the remaining gas in the processing chamber 201 is removed, the NH₃ gas is supplied to the wafer 200 in the processing chamber 201 to perform nitration processing of the layer including silicon and oxygen (an NH₃ gas supply process).

That is, the valve 243b of the second gas supply pipe 232b is opened to cause the NH₃ gas to flow through the second gas supply pipe 232b. The NH₃ gas flowing through the second gas supply pipe 232b is flow-rate-controlled by the MFC 241b. The flow-rate-adjusted NH₃ gas is supplied from the gas supply hole 248b of the second nozzle 233b into the buffer chamber 237b. Here, as high frequency power is applied between the first rod-shaped electrode 269b and the second rod-shaped electrode 270b from the high frequency power supply 273 via the matching device 272, the NH₃ gas supplied into the buffer chamber 237b is plasma-excited to be supplied into the processing chamber 201 from the gas supply hole 238b as an excited species (NH₃*) and exhausted from the exhaust pipe 231. Here, the plasma-excited NH₃ gas is supplied to the wafer 200. Here, simultaneously, the valve 243k is opened to cause the N₂ gas to flow through the second inert gas supply pipe 232k. The N₂ gas is supplied into the processing chamber 201 with the NH₃ gas and exhausted from the exhaust pipe 231.

In addition, simultaneously, the valve 243c of the third gas supply pipe 232c is opened to cause the NH₃ gas to flow through the third gas supply pipe 232c. The NH₃ gas flowing through the third gas supply pipe 232c is flow-rate-controlled by the MFC 241c. The flow-rate-controlled NH₃ gas is supplied into the buffer chamber 237c from the gas supply hole 248c of the third nozzle 233c. Here, as the high frequency power is applied between the first rod-shaped electrode 269c and the second rod-shaped electrode 270c from the high frequency power supply 273 via the matching device 272, the NH₃ gas supplied into the buffer chamber 237c is plasma-excited to be supplied into the processing chamber 201 from the gas supply hole 238c as the excited species (NH₃*) and exhausted from the exhaust pipe 231. Here, the plasma-excited NH₃ gas is supplied to the wafer 200. At the same time, the valve 243l is opened to cause the N₂ gas to flow through the third inert gas supply pipe 232l. The N₂ gas is supplied into the processing chamber 201 with the NH₃ gas and exhausted from the exhaust pipe 231.

Here, in order to prevent invasion of the NH₃ gas into the first nozzle 233a, the valve 243j is opened to cause the N₂ gas to flow through the first inert gas supply pipe 232j. The N₂ gas is supplied into the processing chamber 201 via the first gas supply pipe 232a and the first nozzle 233a and exhausted from the exhaust pipe 231.

When the NH₃ gas is plasma-excited to be flowed as the excited species, the APC valve 244 is appropriately adjusted such that the pressure in the processing chamber 201 is a pressure within a range of, for example, 1 to 1,000 Pa. Each supply flow rate of the NH₃ gas controlled by the MFCs 241b and 241c is a flow rate within a range of, for example, 100 to 10,000 sccm (0.1 to 10 slm). Each supply flow rate of the N₂ gas controlled by the MFCs 241k, 241l and 241j is a flow rate within a range of, for example, 100 to 10,000 sccm (0.1 to 10 slm). A time in which the excited species obtained by plasma-exciting the NH₃ gas is supplied to the wafer 200, i.e., a gas supply time (an exposure time), is a time within a range of, for example, 1 to 120 seconds.

The temperature of the heater 207 is a temperature at which the layer including silicon and oxygen is nitrated in consideration of the throughput, and may be set such that the temperature is within the same temperature range as upon supply of the Si₂Cl₆O gas in step S10, i.e., the temperature in the processing chamber 201 in step S10 to step S14 is similarly held within the temperature range. In this case, the temperature of the heater 207 may be set such that the temperature of the wafer 200 in step S10 to step S14, i.e., the temperature in the processing chamber 201, is uniformly maintained at a temperature within a range of 350 to 950° C., preferably 600 to 900° C., and more particularly 700 to 900° C. In addition, the temperature of the heater 207 may be set such that the temperature in the processing chamber 201 is maintained at the similar temperature range throughout step S10 to step S16 (to be described below).

The high frequency power applied between the first rod-shaped electrodes 269b and 269c and the second rod-shaped electrodes 270b and 270c from the high frequency power supply 273 is set to be power within a range of, for example, 50 to 1,000 W. Here, the NH₃ gas may be thermally excited, i.e., thermally activated, and supplied. However, in order to obtain sufficient nitriding power when the NH₃ gas is thermally activated and flowed under a pressure reduction atmosphere, the pressure in the processing chamber 201 should be a pressure within a relatively high pressure range, for example, a range of 10 to 3,000 Pa, and the temperature of the wafer 200 should be 550° C. or more. Accordingly, when the NH₃ gas is plasma-excited, i.e., plasma-activated and supplied, the sufficient nitriding power can be obtained even when the temperature in the processing chamber 201 is, for example, 300° C. or more. In addition, when the NH₃ gas is plasma-excited and flowed, the sufficient nitriding power can be obtained even when the temperature in the processing chamber 201 is a normal temperature. However, when the temperature in the processing chamber 201 is less than 150° C., reaction byproducts such as ammonium chloride (NH₄Cl) or the like are stuck to the inside of the processing chamber 201, the wafer 200, and so on. Accordingly, the temperature in the processing chamber 201 may be 150° C. or more, and in the embodiment, is 350° C. or more, like in step S10. In addition, since the NH₃ gas can generate a soft reaction through thermal excitation and supply rather than plasma excitation and supply, the following nitration can be softly performed.

As the NH₃ gas is supplied into the processing chamber 201 under the above-mentioned condition, the NH₃ gas that becomes the excited species through plasma excitation or thermal excitation is formed on the wafer 200 in step S10 and reacted with at least a portion of the layer including silicon and oxygen. Accordingly, the layer including silicon and oxygen is nitrated, and the layer including silicon and oxygen is changed (modified) into a silicon nitride layer (Si₃N₄ layer, hereinafter, simply referred to as a SiN layer) serving as a nitride layer, or a silicon oxynitride layer (a SiON layer) serving as an oxynitride layer.

In addition, when an oxygen element of the layer including silicon and oxygen is desorbed upon the nitration, the layer including silicon and oxygen can be modified into a SiN layer, and when an oxygen element of the layer including silicon and oxygen remains, the layer including silicon and oxygen can be modified into a SiON layer. Adjustment of the oxygen element of the layer including silicon and oxygen can be performed by adjusting the nitriding power of the plasma-excited or thermally excited NH₃ gas. In addition, since the nitriding power can be further increased when the plasma-excited $NH_3$ gas is supplied rather than supplying the thermally excited $NH_3$ gas, the layer including silicon and oxygen can be easily modified into the SiN layer. In addition, since the nitriding power can be further suppressed when the thermally excited $NH_3$ gas is supplied rather than when the plasma-excited $NH_3$ gas is supplied, the layer including silicon and oxygen can be easily modified into the SiON layer. However, as described above, since the $Si_2Cl_6O$ gas has strong Si—O bonding and the storing Si—O bonding is incorporated in the layer including silicon and oxygen, the layer including silicon and oxygen also has the Si—O bonding. Accordingly, the oxygen element of the layer including silicon and oxygen cannot easily be completely desorbed through the above-mentioned nitration, and at least a portion of the Si—O bonding included in the layer including silicon and oxygen is not broken but held even when the above-mentioned nitration is performed. Accordingly, the SiN layer or the SiN film described herein refers specifically to the SiN layer or the SiN film slightly including oxygen, for example, the SiN layer or the SiN film including oxygen at an impurity level. That is, the SiN layer or the SiN film described herein refers to the SiN layer or the SiN film having a low oxygen concentration, and since the SiN layer or the SiN film is an almost pure SiN layer or SiN film but slightly includes oxygen, they may be considered as the SiON layer or the SiON film. In the description, these terms are used with the same meaning for the convenience of description.

In step S14, a plurality of (herein, two) plasma generating units are used to reduce the high frequency power applied to each plasma generating unit (the excitation unit), a plasma output of each plasma generating unit (the excitation unit) is set to a low output, and a supply amount of the excited species to the wafer 200 can be increased. Accordingly, a supply amount of the excited species to the wafer 200 can be increased while suppressing plasma damage to the wafer 200 or the layer including silicon and oxygen.

In addition, a supply amount of the excited species to the wafer 200 can be increased while suppressing the plasma damage to the wafer 200 or the layer including silicon and oxygen, and the nitriding power can be increased to accelerate nitration of the layer including silicon and oxygen. That is, nitration efficiency can be increased. In addition, nitration of the layer including silicon and oxygen can be saturated to be rapidly transited to a state in which a self limit is applied (a state in which the nitration is completely terminated), and a nitration time can be reduced. Eventually, a processing time can be reduced. Further, wafer in-surface uniformity of the nitration can be improved. That is, the excited species can be more uniformly supplied to the entire region of the surface of the wafer 200, and for example, it is possible to prevent generation of a remarkable difference in nitration level between the vicinity of an outer circumference of the wafer 200 and a center of the wafer 200.

In addition, a supply amount of the excited species to the wafer 200 can be increased while suppressing plasma damage to the wafer 200 or the layer including silicon and oxygen using the plurality of plasma generating units, and chlorine included in the layer including silicon and oxygen formed in step S10 can be efficiently desorbed. Accordingly, the silicon nitride layer or the silicon oxynitride layer having an extremely low chlorine concentration can be formed. In addition, nitration efficiency can be further improved by efficiently desorbing the chlorine. That is, nitration efficiency can also be improved by efficiently desorbing the chlorine, which causes degradation of nitration, from the layer including silicon and oxygen. Further, the chlorine desorbed from the layer including silicon and oxygen is exhausted from the exhaust pipe 231 to the outside of the processing chamber 201.

In addition to the ammonia ($NH_3$) gas, diazene ($N_2H_2$) gas, hydrazine ($N_2H_4$) gas, $N_3H_8$ gas, and so on may be used as the nitrogen-containing gas. Further, an amine-based gas containing a nitrogen element such as ethylamine, methylamine, and so on, may be used.

(Step S16)

After the layer including silicon and oxygen is changed into the silicon nitride layer or the silicon oxynitride layer, the valve 243b of the second gas supply pipe 232b and the valve 243c of the third gas supply pipe 232c are closed to stop supply of the $NH_3$ gas. Here, the APC valve 244 of the exhaust pipe 231 is opened to vacuum-exhaust the inside of the processing chamber 201 by the vacuum pump 246, and the $NH_3$ gas or reaction byproducts after non-reaction or contribution to formation of the silicon nitride layer or the silicon oxynitride layer remaining in the processing chamber 201 are discharged from the inside of the processing chamber 201. In addition, the valves 243k, 243l and 243j are opened to maintain supply of the $N_2$ gas serving as an inert gas into the processing chamber 201. The $N_2$ gas acts as a purge gas, and can further increase an effect of discharging the $NH_3$ gas or reaction byproducts after non-reaction or contribution to formation of the silicon nitride layer or the silicon oxynitride layer remaining in the processing chamber 201 from the inside of the processing chamber 201 (a second purge process).

In addition, here, the gas remaining in the processing chamber 201 may not be completely discharged, and the inside of the processing chamber 201 may not be completely purged. When the gas remaining in the processing chamber 201 is minute, there is no bad influence generated in step S10 performed thereafter. Here, a flow rate of the $N_2$ gas supplied into the processing chamber 201 need not be a large flow rate, and for example, substantially the same amount of gas as a volume of the reaction pipe 203 (the processing chamber 201) can be supplied to perform the purge such that there is no bad influence generated in step S10. As described above, a purge time can be reduced to improve throughput as the inside of the processing chamber 201 is not completely purged. In addition, consumption of the $N_2$ gas can be suppressed to a necessary minimum value.

At this time, the temperature of the heater 207 is set such that the temperature of the wafer 200 is uniformly maintained at a temperature within a range of 350 to 950° C., preferably 600 to 900° C., and more preferably 700 to 900° C., as in supply of the $NH_3$ gas. A supply flow rate of the $N_2$ gas serving as a purge gas supplied from each inert gas supply system is a flow rate within a range of, for example, 100 to 10,000 sccm (0.1 to 10 slm). In addition to the $N_2$ gas, a rare gas such as Ar, He, Ne, Xe, and so on may be used as the purge gas.

The silicon nitride film (a $Si_3N_4$ film, hereinafter, simply referred to as a SiN film) or the silicon oxynitride film (a SiON film) having a predetermined film thickness may be formed on the wafer 200 by performing a cycle a predetermined number of times, preferably, a plurality of times, the cycle including the above-mentioned steps S10 to S16.

In addition, the phrase "a predetermined gas is supplied to the wafer 200" described in each step after at least the second cycle when the above-mentioned cycle is repeated means that "a predetermined gas is supplied to the layer formed on the wafer 200, i.e., the outermost surface of the wafer 200, which is a stacked body," and the phrase "a predetermined layer is formed on the wafer 200" means that "a predetermined layer is formed on the layer formed on the wafer 200, i.e., the outermost surface of the wafer 200, which is a stacked body." This is as described above. Further, this is the same as in another embodiment (to be described below).

(Purge and Return to Atmospheric Pressure)

When the silicon nitride film or the silicon oxynitride film having a predetermined film thickness is formed, the valves 243j, 243k and 243l are opened to supply the $N_2$ gas serving as an inert gas from each inert gas supply system into the processing chamber 201 and exhaust the $N_2$ gas from the exhaust pipe 231. The $N_2$ gas acts as the purge gas, and the inside of the processing chamber 201 is purged with the inert gas so that the gas remaining in the processing chamber 201 is removed from the inside of the processing chamber 201 (purge). Next, the atmosphere in the processing chamber 201 is substituted with the inert gas, and the pressure in the processing chamber 201 is returned to a normal pressure (return to atmospheric pressure).

(Boat Unloading and Wafer Discharging)

Next, the seal cap 219 is lowered by the boat elevator 115 to open the lower end of the reaction pipe 203, and the processed wafer 200 is unloaded from the lower end of the reaction pipe 203 to the outside of the reaction pipe 203 while being held by the boat 217 (boat unloading). Next, the processed wafer 200 is discharged from the boat 217 (wafer discharging).

According to the embodiment, since the SiN film or the SiON film is formed on the wafer 200 by performing a cycle a predetermined number of times, the cycle including a process of supplying a source gas ($Si_2Cl_6O$) containing Si, Cl and O and having Si—O bonding to the wafer 200, and a process of supplying a nitriding gas ($NH_3$) to the wafer 200, the SiN film or the SiON film having good film thickness uniformity and step coverage properties can be formed at a low hydrogen concentration while suppressing generation of particles.

In addition, according to the embodiment, when the SiON film is formed using a source gas serving as both a silicon source and an oxygen source, a process of separately supplying an oxygen source such as $O_2$ gas or the like may be omitted. Conventionally, while three kinds of gases serving as a silicon source, an oxygen source and a nitrogen source are used when the SiON film is formed, according to the embodiment, the SiON film can be formed using only two kinds of gases. Accordingly, one of the gas supply processes can be omitted, and thus a cycle rate (a thickness of the SiON layer formed in a unit cycle), i.e., a film-forming rate, can be improved to improve throughput. In addition, a gas supply line for separately supplying the oxygen source can be omitted (one gas supply line can be omitted), and thus equipment cost can also be reduced.

Further, according to the embodiment, in addition to hydrogen in the film, a content of chlorine in the film can also be reduced and thus, the SiN film or the SiON film having an extremely low chlorine concentration can be formed. That is, the SiN film or the SiON film including hydrogen or chlorine having an extremely low impurity concentration and good film thickness uniformity and step coverage properties can be formed.

In addition, according to the embodiment, high frequency power applied to each of the plasma generating units (the excitation units) can be reduced using the plurality of plasma generating units to decrease the plasma output of each of the plasma generating units (the excitation units) and the supply amount of the excited species to the wafer 200 can be increased. Accordingly, the supply amount of the excited species to the wafer 200 can be increased while suppressing plasma damage to the wafer 200, the layer including Si and O, the SiN layer or the SiON layer.

<Another Embodiment of the Present Invention>

Hereinabove, while the embodiment of the present invention has been described in detail, the present invention is not limited to the above-mentioned embodiment but may be variously varied without departing from the spirit of the present invention.

For example, in the above-mentioned embodiment, while the case in which the two plasma generating units (excitation units) are installed has been described, the present invention is not limited thereto. For example, even when one plasma generating unit (excitation unit) is installed, the present invention may be appropriately applied. However, as the plurality of plasma generating units (excitation units) are installed, the wafer in-surface uniformity of the nitration can be further improved as described above, and thus wafer in-surface film quality uniformity and wafer in-surface film thickness uniformity of the SiN film or the SiON film can be further improved. That is, an effect of the nitration can be increased by installing the plurality of plasma generating units. In addition, the present invention may be appropriately applied to the case in which three or more plasma generating units (excitation units) are installed.

In addition, in the above-mentioned embodiment, while the example in which the plasma generating unit is installed has been described, the thermally excited $NH_3$ gas can also be used in step S14, and in this case, the plasma generating unit can also be omitted. In this case, the $NH_3$ gas may be directly supplied into the processing chamber 201 from the second nozzle 233b and the third nozzle 233c without installing the buffer chambers 237b and 237c in the processing chamber 201. In this case, the $NH_3$ gas can also be directly supplied to the wafer 200 from the second nozzle 233b and the third nozzle 233c by directing the gas supply holes 248b and 248c of the second nozzle 233b and the third nozzle 233c toward a center of the reaction pipe 203. In addition, in this case, only one nozzle configured to supply the $NH_3$ gas may be installed. For example, only the second nozzle 233b may be installed without installing the third nozzle 233c, or only the third nozzle 233c may be installed without installing the second nozzle 233b. Further, only the buffer chambers 237b and 237c may be installed without installing the second nozzle 233b and the third nozzle 233c. In this case, only one buffer chamber may be provided. For example, only the buffer chamber 237b may be installed without installing the buffer chamber 237c, or only the buffer chamber 237c may be installed without installing the buffer chamber 237b.

According to the above-mentioned embodiment, the SiN film or the SiON film having an extremely low hydrogen concentration in the film and good film thickness uniformity and step coverage properties can be formed, and reliability of a tunnel insulating film can be improved using the SiN film or the SiON film as the tunnel insulating film of the flash memory, realizing a high quality flash memory.

In addition, the SiN film or the SiON film formed in the above-mentioned embodiment has a low chlorine concentration in the film, a high film density, and high resistance against hydrogen fluoride. For this reason, the SiN film or the SiON film formed in the above-mentioned embodiment may be appropriately used as a sidewall spacer or an etching stopper layer as well as a tunnel insulating film, a gate insulating film or a capacitive insulating film. In addition, for example, the film may be appropriately used as a hard mask in an STI forming process.

In addition, for example, while the example in which a silicon nitride film (a SiN film) or a silicon oxynitride film (a SiON film) is formed has been described in the above-mentioned embodiment, the present invention is not limited thereto. For example, the present invention may be appropriately applied even when a silicon oxycarbide film (a SiOC film), a silicon oxycarbonitride film (a SiOCN film), a silicon boron oxide film (a SiBO film), a silicon boron oxynitride film (a SiBON film), or a silicon boron oxycarbonitride film (a SiBOCN film) is formed. That is, the present invention may be appropriately applied even when a film including Si, O and at least one element selected from the group consisting of N, C and B, which are predetermined elements, is formed.

For example, as shown in FIG. 6A, the SiOC film may be formed using a carbon-containing gas, instead of the nitrogen-containing gas, serving as a reactive gas containing at least one element selected from the group consisting of N, C and B. For example, a hydrocarbon-based gas such as propylene ($C_3H_6$) gas or the like may be used as the carbon-containing gas. In this case, as shown in FIG. 6A, the SiOC film may be formed on the wafer 200 by performing a cycle a predetermined number of times, the cycle including a process of supplying the $Si_2Cl_6O$ gas to the wafer 200 and a process of supplying the $C_3H_6$ gas to the wafer 200. The $C_3H_6$ gas may be supplied from the second gas supply system (the reactive gas supply system). In the process of supplying the $C_3H_6$ gas, the layer including Si and O formed in the process of supplying the $Si_2Cl_6O$ gas can be modified to form the SiOC layer. The purge process after supply of each gas is performed as in the above-mentioned embodiment. Here, for example, the processing condition may be the same as that of the above-mentioned embodiment. In addition, the $C_3H_6$ gas may be thermally excited and supplied, rather than plasma-excited. In addition to the $C_3H_6$ gas, a hydrocarbon-based gas such as acetylene ($C_2H_2$) gas, ethylene ($C_2H_4$) gas, or the like, may be used as the carbon-containing gas. Even in this case, the same effect as of the above-mentioned embodiment can be obtained. In addition, in this case, since the process of separately supplying an oxidant such as $O_2$ gas or the like can be omitted, desorption of C from the SiOC layer due to oxidation of the SiOC layer can be prevented.

Figure 6B:
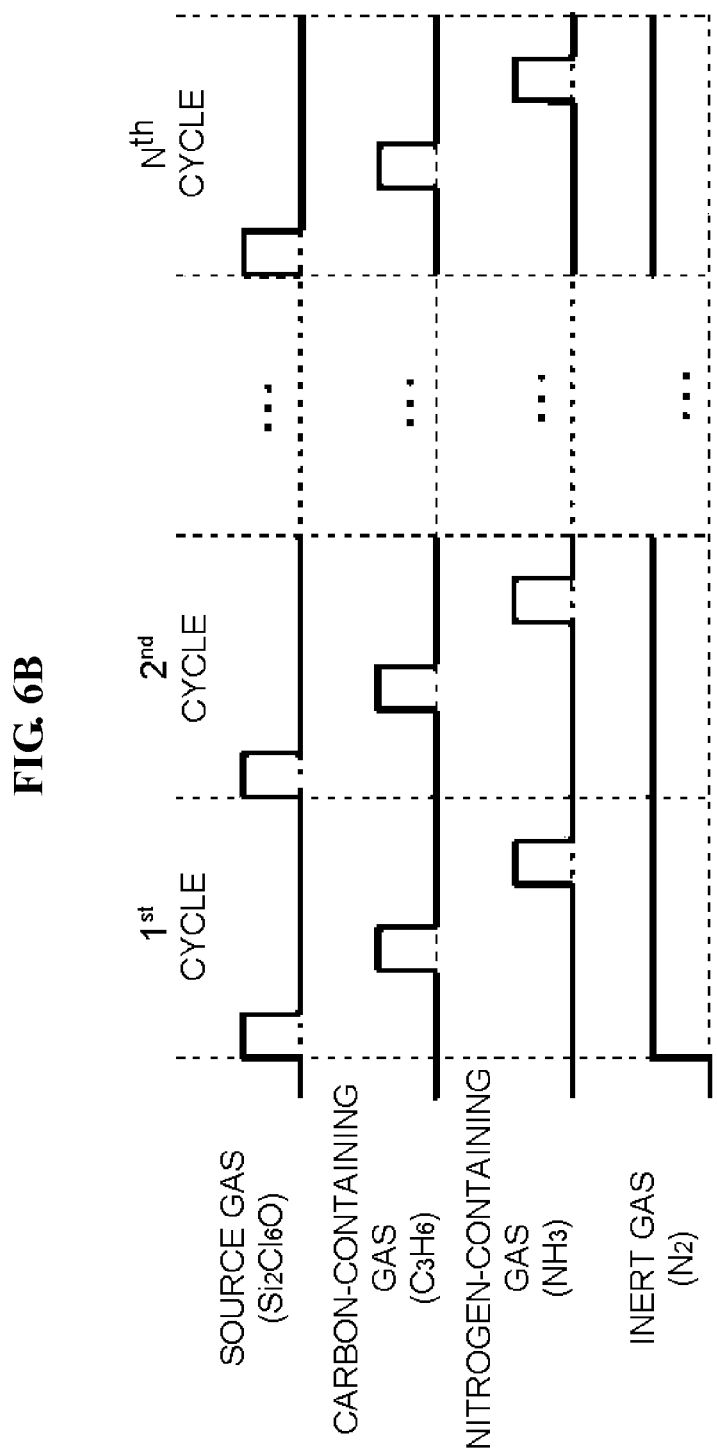

In addition, for example, as shown in FIG. 6B, the SiOCN film may be formed using the carbon-containing gas and the nitrogen-containing gas serving as a reactive gas containing at least one element selected from the group consisting of N, C and B. As in the film-forming sequence of FIG. 6A, the hydrocarbon-based gas may be used as the carbon-containing gas. Like the above-mentioned embodiment, the nitriding gas may be used as the nitrogen-containing gas. In this case, as shown in FIG. 6B, the SiOCN film may be formed on the wafer 200 by performing a cycle a predetermined number of times, the cycle including a process of supplying the $Si_2Cl_6O$ gas to the wafer 200, a process of supplying the $C_3H_6$ gas to the wafer 200 and a process of supplying the $NH_3$ gas to the wafer 200. The $C_3H_6$ gas and the $NH_3$ gas may be supplied from the second gas supply system (the reactive gas supply system). In the process of supplying the $C_3H_6$ gas, the layer including Si and O formed in the process of supplying the $Si_2Cl_6O$ gas is modified to form the SiOC layer. In the process of supplying the $NH_3$ gas, the SiOC layer formed in the process of supplying the $C_3H_6$ gas is modified to form the SiOCN layer. The purge process after supply of each gas is performed in the same manner as in the above-mentioned embodiment. Here, for example, the processing condition may be the same as that of the above-mentioned embodiment. In addition, as in the film-forming sequence of FIG. 6A, the $C_3H_6$ gas may be thermally excited and supplied. In addition, as in the film-forming sequence of FIG. 6A, the above-mentioned gases may be used as the carbon-containing gas.

Even in this case, the same effect as of the above-mentioned embodiment can be obtained. In addition, even in this case, as the source gas serving as both a silicon source and an oxygen source is used, even when the SiOCN film is formed, the process of separately supplying the oxygen source such as $O_2$ gas or the like can be omitted. Conventionally, when the SiOCN film is formed, while four kinds of gases serving as a silicon source, an oxygen source, a carbon source and a nitrogen source are used, only three kinds of gases may be used to form the SiOCN film according to the embodiment. Accordingly, one of the gas supply processes can be omitted and a cycle rate (a thickness of the SiOCN layer formed in a unit cycle), i.e., a film-forming rate, can be improved, improving throughput. In addition, since a gas supply line configured to separately supply the oxygen source can be omitted (since one of the gas supply lines can be omitted), equipment cost can be reduced. Further, in this case, since a process of separately supplying an oxidant such as $O_2$ gas or the like can be omitted, desorption of C from the SiOC layer or the SiOCN layer due to oxidation of the SiOC layer or the SiOCN layer can be prevented.

In addition, for example, as shown in FIG. 6C, the SiOCN film may be formed using the gas containing nitrogen and carbon, serving as a reactive gas containing at least one element selected from the group consisting of N, C and B. For example, an amine-based gas such as triethylamine [$(C_2H_5)_3N$, abbreviation: TEA] gas or the like may be used as the gas containing nitrogen and carbon. In this case, as shown in FIG. 6C, the SiOCN film may be formed on the wafer 200 by performing a cycle a predetermined number of times, the cycle including a process of supplying the $Si_2Cl_6O$ gas to the wafer 200 and a process of supplying the TEA gas to the wafer 200. The TEA gas may be supplied from the second gas supply system (the reactive gas supply system). In the process of supplying the TEA gas, the layer including Si and O formed in the process of supplying the $Si_2Cl_6O$ gas is modified to form the SiOCN layer. The purge process after supply of each gas is performed in the same manner as in the above-mentioned embodiment. Here, for example, the processing condition is the same as that of the above-mentioned embodiment. In addition, the TEA gas may be thermally excited and supplied, rather than being plasma-excited like the $C_3H_6$ gas.

In addition to the TEA gas, for example, an ethylamine-based gas such as diethylamine [$(C_2H_5)_2NH$, abbreviation: DEA] gas, monoethylamine ($C_2H_5NH_2$, abbreviation: MEA) gas, or the like, a methylamine-based gas such as trimethylamine [$(CH_3)_3N$, abbreviation: TMA] gas, dimethylamine [$(CH_3)_2NH$, abbreviation: DMA] gas, monomethylamine ($CH_3NH_2$, abbreviation: MMA) gas, or the like, a propylamine-based gas such as tripropylamine [$(C_3H_7)_3N$, abbreviation: TPA] gas, dipropylamine [$(C_3H_7)_2NH$, abbreviation: DPA] gas, monopropylamine ($C_3H_7NH_2$, abbreviation: MPA) gas, or the like, an isopropylamine-based gas such as triisopropylamine ([$(CH_3)_2CH]_3N$, abbreviation: TIPA) gas, diisopropylamine ([$(CH_3)_2CH]_2NH$, abbreviation: DIPA) gas, monoisopropylamine [$(CH_3)_2CHNH_2$, abbreviation: MIPA] gas, or the like, a butylamine-based gas such as tributylamine [$(C_4H_9)_3N$, abbreviation: TBA] gas, dibutylamine [$(C_4H_9)_2NH$, abbreviation: DBA] gas, monobutylamine ($C_4H_9NH_2$, abbreviation: MBA) gas, or the like, or an isobutylamine-based gas such as triisobutylamine ($[(CH_3)_2CHCH_2]_3N$, abbreviation: TIBA) gas, diisobutylamine ($[(CH_3)_2CHCH_2]_2NH$, abbreviation: DIBA) gas, monoisobutylamine [$(CH_3)_2CHCH_2NH_2$, abbreviation: MIBA] gas, or the like, may be used as the amine-based gas serving as the gas containing nitrogen and carbon. That is, for example, at least one gas of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, $[(CH_3)_2CHCH_2]_xNH_{3-x}$ (in these formulae, x is an integer of 1 to 3) may be used as the amine-based gas.

In addition, instead of the amine-based gas, an organic hydrazine-based gas may also be used as the gas containing nitrogen and carbon. For example, a methyl hydrazine-based gas such as monomethyl hydrazine [$(CH_3)HN_2H_2$, abbreviation: MMH] gas, dimethyl hydrazine [$(CH_3)_2N_2H_2$, abbreviation: DMH] gas, trimethyl hydrazine [$(CH_3)_2N_2(CH_3)H$, abbreviation: TMH] gas, or the like, or an ethyl hydrazine-based gas such as ethyl hydrazine [$(C_2H_5)HN_2H_2$, abbreviation: EH] or the like, may be used as the organic hydrazine-based gas.

Even in this case, the same effect as of the above-mentioned embodiment can be obtained. In addition, in this case, when the SiOCN film is formed using the source gas serving as both a silicon source and an oxygen source, or using the reactive gas serving as both a carbon source and a nitrogen source, the process of separately supplying the oxygen source such as $O_2$ gas or the like or the nitrogen source such as $NH_3$ gas or the like can be omitted. Conventionally, when the SiOCN film is formed, while four kinds of gases serving as a silicon source, an oxygen source, a carbon source and a nitrogen source are used, according to the embodiment, only two kinds of gases may be used to form the SiOCN film. Accordingly, two of the gas supply processes can be omitted, and a cycle rate (a thickness of the SiOCN layer formed in a unit cycle), i.e., a film-forming rate, can be improved, improving throughput. In addition, since a gas supply line configured to separately supply the oxygen source or the nitrogen source can be omitted (since two gas supply lines can be omitted), equipment cost can also be reduced. In addition, in this case, since a process of separately supplying an oxidant such as $O_2$ gas or the like, desorption of C from the SiOCN layer due to oxidation of the SiOCN layer can be prevented.

In addition, for example, as shown in FIG. 7A, instead of the nitrogen-containing gas, the SiBO film may be formed using a boron-containing gas serving as a reactive gas containing at least one element selected from the group consisting of N, C and B. For example, a boron-based gas such as boron trichloride ($BCl_3$) gas or the like may be used as the boron-containing gas. In this case, as shown in FIG. 7A, the SiBO film may be formed on the wafer 200 by performing a cycle a predetermined number of times, the cycle including a process of supplying the $Si_2Cl_6O$ gas to the wafer 200 and a process of supplying the $BCl_3$ gas to the wafer 200. The $BCl_3$ gas may be supplied from the second gas supply system (the reactive gas supply system). In the process of supplying the $BCl_3$ gas, the layer including Si and O formed in the process of supplying the $Si_2Cl_6O$ gas is modified to form the SiBO layer. The purge process after supply of each gas is performed in the same manner as in the above-mentioned embodiment. Here, for example, the processing condition may be the same as that of the above-mentioned embodiment. In addition, the $BCl_3$ gas may be thermally excited and supplied, rather than being plasma-excited like the $C_3H_6$ gas. In addition to the $BCl_3$ gas, for example, a boron-based (borane-based) gas such as diborane ($B_2H_6$) or the like may be used as the boron-containing gas. Even in this case, the same effect as of the above-mentioned embodiment can be obtained. In addition, in this case, since the process of separately supplying an oxidant such as $O_2$ gas or the like can be omitted, desorption of B from the SiBO layer due to oxidation of the SiBO layer can be prevented.

In addition, for example, as shown in FIG. 7B, the SiBON film may be formed using the boron-containing gas and the nitrogen-containing gas serving as a reactive gas containing at least one element selected from the group consisting of N, C and B. The same boron-based gas as in the film-forming sequence of FIG. 7A may be used as the boron-containing gas. The same nitriding gas as in the above-mentioned embodiment may be used as the nitrogen-containing gas. In this case, as shown in FIG. 7B, the SiBON film may be formed on the wafer 200 by performing a cycle a predetermined number of times, the cycle including a process of supplying the $Si_2Cl_6O$ gas to the wafer 200, a process of supplying the $BCl_3$ gas to the wafer 200 and a process of supplying the $NH_3$ gas to the wafer 200. The $BCl_3$ gas and the $NH_3$ gas may be supplied from the second gas supply system (the reactive gas supply system). In the process of supplying the $BCl_3$ gas, the layer including Si and O formed in the process of supplying the $Si_2Cl_6O$ gas is modified to form the SiBO layer. In the process of supplying the $NH_3$ gas, the SiBO layer formed in the process of supplying the $BCl_3$ gas is modified to form the SiBON layer. The purge process after supply of each gas is performed in the same manner as in the above-mentioned embodiment. Here, for example, the processing condition is the same as in the above-mentioned embodiment. In addition, like in the film-forming sequence of FIG. 7A, the $BCl_3$ gas may be thermally excited and supplied. In addition, the gas that can be used as the boron-containing gas is the same as in the film-forming sequence of FIG. 7A.

Even in this case, the same effect as of the above-mentioned embodiment can be obtained. In addition, even in this case, when the SiBON film is formed using the source gas serving as both a silicon source and an oxygen source, the process of separately supplying the oxygen source such as $O_2$ gas or the like can be omitted. Conventionally, when the SiBON film is formed, while four kinds of gases serving as a silicon source, a boron source, an oxygen source and a nitrogen source are used, according to the embodiment, the SiBON film can be formed using only three kinds of gases. Accordingly, one of the gas supply processes can be omitted, and a cycle rate (a thickness of the SiBON layer formed in a unit cycle), i.e., a film-forming rate, can be improved, improving throughput. In addition, since a gas supply line configured to separately supply the oxygen source can be omitted (since one gas supply line can be omitted), equipment cost can also be reduced. Further, in this case, since the process of separately supplying an oxidant such as $O_2$ gas or the like can be omitted, desorption of B from the SiBO layer or the SiBON layer due to oxidation of the SiBO layer or the SiBON layer can be prevented.

Figure 7C:
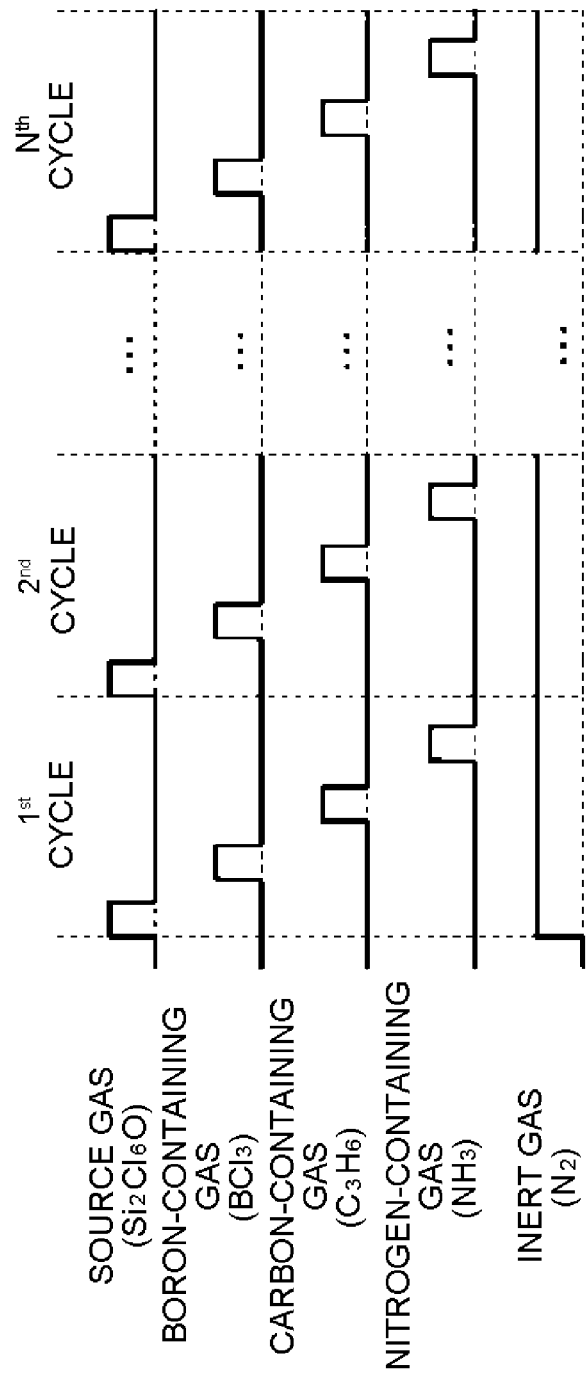

In addition, for example, as shown in FIG. 7C, the SiBOCN film may be formed using the boron-containing gas, the carbon-containing gas and the nitrogen-containing gas, serving as a reactive gas containing at least one element selected from the group consisting of N, C and B. The same boron-based gas as in the film-forming sequence of FIG. 7A may be used as the boron-containing gas. The same hydrocarbon-based gas as in the film-forming sequence FIG. 6A may be used as the carbon-containing gas. The same nitriding gas as in the above-mentioned embodiment may be used as the nitrogen-containing gas. In this case, as shown in FIG. 7C, the SiBOCN film may be formed on the wafer 200 by performing a cycle a predetermined number of times, the cycle including a process of supplying the $Si_2Cl_6O$ gas to the wafer 200, a process of supplying the $BCl_3$ gas to the wafer 200, a process of supplying $C_3H_6$ gas to the wafer 200, and a process of supplying the $NH_3$ gas to the wafer 200. The $BCl_3$ gas, the $C_3H_6$ gas and the $NH_3$ gas may be supplied from the second gas supply system (the reactive gas supply system). In the process of supplying the $BCl_3$ gas, the layer including Si and O formed in the process of supplying the $Si_2Cl_6O$ gas is modified to form the SiBO layer. In the process of supplying the $C_3H_6$ gas, the SiBO layer formed in the process of supplying the $BCl_3$ gas is modified to form the SiBOC layer. In the process of supplying the $NH_3$ gas, the SiBOC layer formed in the process of supplying the $C_3H_6$ gas is modified to form the SiBOCN layer. The purge process after supply of each gas is performed in the same manner as in the above-mentioned embodiment. Here, for example, the processing condition is the same as in the above-mentioned embodiment. In addition, like in the film-forming sequence of FIG. 6A and the film-forming sequence of FIG. 7A, the $C_3H_6$ gas or the $BCl_3$ gas may be thermally excited and supplied. In addition, the gas that can be used as the carbon-containing gas or the boron-containing gas is the same as in the film-forming sequence of FIG. 6A and the film-forming sequence of FIG. 7A.

Even in this case, the same effect as of the above-mentioned embodiment can be obtained. In addition, even in this case, when the SiBOCN film is formed using the source gas serving as both a silicon source and an oxygen source, the process of separately supplying the oxygen source such as $O_2$ gas or the like can be omitted. Conventionally, when the SiBOCN film is formed, while five kinds of gases serving as a silicon source, a boron source, an oxygen source, a carbon source and a nitrogen source, are used, according to the present invention, the SiBOCN film may be formed using only four kinds of gases. Accordingly, one of the gas supply processes can be omitted, and a cycle rate (a thickness of the SiBOCN layer formed in a unit cycle), i.e., a film-forming rate, can be improved, improving throughput. In addition, since a gas supply line configured to separately supply the oxygen source can be omitted (since one gas supply line can be omitted), equipment cost can be reduced. Further, in this case, the SiBOCN film may be formed using only three kinds of gases using the gas containing nitrogen and carbon such as the amine-based gas, instead of the carbon-containing gas and the nitrogen-containing gas. In this case, two of the gas supply processes can be omitted, and two of the gas supply lines can be omitted. Further, in this case, since a process of separately supplying an oxidant such as $O_2$ gas or the like can be omitted, desorption of B or C from the SiBO layer, the SiBOC layer or the SiBOCN layer due to oxidation of the SiBO layer, the SiBOC layer or the SiBOCN layer can be prevented.

In addition, for example, as shown in FIG. 8A, the SiBOCN film may be formed using a gas containing boron, nitrogen and carbon serving as a reactive gas containing at least one element selected from the group consisting of N, C and B. For example, a borazine-based gas (borazine compound) such as n,n',n''-trimethyl borazine (abbreviation: TMB) gas or the like may be used as the gas containing boron, nitrogen and carbon. In this case, as shown in FIG. 8A, the SiBOCN film may be formed on the wafer 200 by performing a cycle a predetermined number of times, the cycle including a process of supplying the $Si_2Cl_6O$ gas to the wafer 200 and a process of supplying the TMB gas to the wafer 200. The TMB gas may be supplied from the second gas supply system (the reactive gas supply system). In the process of supplying the TMB gas, the layer including Si and O formed in the process of supplying the $Si_2Cl_6O$ gas is modified to form the SiBOCN layer. The purge process after supply of each gas is performed in the same manner as in the above-mentioned embodiment. Here, for example, the processing condition may be the same as that of the above-mentioned embodiment. In addition, the TMB gas may be thermally excited and supplied, rather than being plasma-excited. In addition to the TMB gas, for example, an organic borazine-based gas such as n,n',n''-triethyl borazine (abbreviation: TEB) gas, n,n',n''-tri-n-propyl borazine (abbreviation: TPB) gas, n,n',n''-triisopropyl borazine (abbreviation: TIPB) gas, n,n',n''-tri-n-butyl borazine (abbreviation: TBB) gas, n,n',n''-triisobutyl borazine (abbreviation: TIBB) gas, or the like, may be used as the borazine-based gas.

Even in this case, the same effect as of the above-mentioned embodiment can be obtained. In addition, in this case, when the SiBOCN film is formed using the source gas serving as both a silicon source and an oxygen source and further using the reactive gas serving as a boron source, a nitrogen source and a carbon source, the process of separately supplying the oxygen source such as $O_2$ gas or the like, the nitrogen source such as $NH_3$ gas or the like, or the carbon source such as $C_3H_6$ gas or the like, can be omitted. Conventionally, while five kinds of gases serving as a silicon source, a boron source, an oxygen source, a carbon source and a nitrogen source are used when the SiBOCN film is formed, according to the embodiment, the SiBOCN film can be formed using only two kinds of gases. Accordingly, three of the gas supply processes can be omitted, and a cycle rate (a thickness of the SiBOCN layer formed in a unit cycle), i.e., a film-forming rate, can be improved, improving throughput. In addition, since a gas supply line configured to separately supply the oxygen source, the nitrogen source or the carbon source can be omitted (since three gas supply lines can be omitted), equipment cost can be reduced. Further, in this case, since the process of separately supplying an oxidant such as $O_2$ gas or the like can be omitted, desorption of B from the SiBOCN layer due to oxidation of the SiBOCN layer can be prevented. In addition, in this case, a borazine ring frame included in the TMB, which is a borazine compound, can be maintained (held) under the above-mentioned processing condition, and the borazine ring frame is incorporated in the formed layer as it is. That is, the SiBOCN film formed in this case becomes a film including the borazine ring frame. A space at a center of a borazine ring cannot be held due to incorporation into the film while holding the borazine ring frame, and the SiBOCN film can be formed as a porous film. Accordingly, the SiBOCN film having a low dielectric constant (a k value) and high ashing resistance (oxidation resistance) can be formed.

In addition, for example, as shown in FIG. 8B, the SiBOCN film may be formed using the gas containing boron, nitrogen and carbon and the nitrogen-containing gas, serving as a reactive gas containing at least one element selected from the group consisting of N, C and B. The same borazine-based gas as in the film-forming sequence of FIG. 8A can be used as the gas containing boron, nitrogen and carbon. The same nitriding gas as in the above-mentioned embodiment may be used as the nitrogen-containing gas. In this case, as shown in FIG. 8B, the SiBOCN film may be formed on the wafer 200 by performing a cycle a predetermined number of times, the cycle including a process of supplying the $Si_2Cl_6O$ gas to the wafer 200, a process of supplying the TMB gas to the wafer 200 and a process of supplying the $NH_3$ gas to the wafer 200. The TMB gas and the $NH_3$ gas may be supplied from the second gas supply system (the reactive gas supply system). In the process of supplying the TMB gas, the layer including Si and O formed in the process of supplying the $Si_2Cl_6O$ gas is modified to form the SiBOCN layer. In the process of supplying the $NH_3$ gas, the SiBOCN layer formed in the process of supplying the TMB gas is modified to form an N-rich SiBOCN layer. The purge process after supply of each gas is performed in the same manner as in the above-mentioned embodiment. Here, for example, the processing condition may be the same as in the above-mentioned embodiment. In addition, like the film-forming sequence of FIG. 8A, the TMB gas may be thermally excited and supplied. Further, the gas that can be used as the borazine-based gas is the same as that of the film-forming sequence of FIG. 8A.

Even in this case, the same effect as of the above-mentioned embodiment and the film-forming sequence of FIG. 8A can be obtained. In addition, in this case, a nitrogen concentration in the SiBOCN layer formed in the TMB gas supply process can be finely adjusted in the $NH_3$ gas supply process performed thereafter. Specifically, the nitrogen concentration in the SiBOCN layer can be finely adjusted to be higher than the nitrogen concentration in the SiBOCN layer obtained by the film-forming sequence of FIG. 8A. Accordingly, the nitrogen concentration in the finally formed SiBOCN film can be finely adjusted. In addition, under the above-mentioned processing condition, the borazine ring frame included in the SiBOCN layer can be maintained (held) in the $NH_3$ gas supply process without being broken, and the borazine ring frame remains in the modified SiBOCN layer as it is.

In addition, fine adjustment of the nitrogen concentration in the film due to addition of the nitrogen-containing gas supply process (the $NH_3$ gas supply process) may be applied to the film-forming sequence of FIG. 6C. In this case, the $NH_3$ gas supply process may be performed after the TEA gas supply process or simultaneously with these processes. In addition, the oxygen concentration in the film can also be finely adjusted by adding the oxygen-containing gas supply process (the $O_2$ gas supply process). For example, the oxygen concentration in the film can be finely adjusted by adding the $O_2$ gas supply process to the film-forming sequence of FIGS. 6B and 6C. The $O_2$ gas supply process may be performed after the $NH_3$ gas supply process or the TEA gas supply process. In addition, the carbon concentration in the film can be finely adjusted by adding the carbon-containing gas supply process (the $C_3H_6$ gas supply process). For example, the carbon concentration in the film can be finely adjusted by adding the $C_3H_6$ gas supply process to the film-forming sequence of FIG. 6C or the film-forming sequence of FIGS. 8A and 8B. In this case, the $C_3H_6$ gas supply process may be performed before or after the TEA gas supply process or the TMB gas supply process, or simultaneously with these processes.

In addition, for example, while an example in which the silicon nitride film or the silicon oxynitride film including silicon, which is a semiconductor element, is formed as the nitride film or the oxynitride film has been described in the above-mentioned embodiment, the present invention is not limited thereto. For example, the present invention may be preferably applied to the case in which a metal nitride film or a metal oxynitride film including a metal element such as titanium (Ti), zirconium (Zr), hafnium (Hf), tantalum (Ta), aluminum (Al), molybdenum (Mo), or the like, is formed.

For example, the present invention may also be preferably applied to the case in which a titanium nitride film (a TiN film) or a titanium oxynitride film (a TiON film) is formed, a zirconium nitride film (a ZrN film) or a zirconium oxynitride film (a ZrON film) is formed, a hafnium nitride film (a HfN film) or a hafnium oxynitride film (a HfON film) is formed, a tantalum nitride film (a TaN film) or a tantalum oxynitride film (a TaON film) is formed, an aluminum nitride film (an AlN film) or an aluminum oxynitride film (an AlON film) is formed, or a molybdenum nitride film (a MoN film) or a molybdenum oxynitride film (a MoON film) is formed.

In addition, for example, the present invention may be preferably applied to the case in which a metal oxycarbide film, a metal oxycarbonitride film, a metal boron oxide film, a metal boron oxynitride film, or a metal boron oxycarbonitride film including a metal element such as Ti, Zr, Hf, Ta, Al, Mo, or the like, is formed. That is, the present invention may also be preferably applied to the case in which a film including a metal element as a predetermined element, O and at least one element selected from the group consisting of N, C and B is formed.

In this case, the film can be formed by the same film-forming sequence as in the above-mentioned embodiment using the source material including the metal element, chlorine and oxygen serving as the source gas and having a chemical bond of the metal element and oxygen. In addition, when a liquid fuel, which is in a liquid phase under a normal temperature and a normal pressure, is used, the liquid fuel is vaporized by a vaporization system such as a vaporizer, a bubbler, or the like, and then supplied as the source gas. The same gas as in the above-mentioned embodiment may be used as the reactive gas. The same processing condition as that of the above-mentioned embodiment can also be used.

As described above, the present invention may be applied to film formation of a metal nitride film, a metal oxynitride film, a metal oxycarbide film, a metal oxycarbonitride film, a metal boron oxide film, a metal boron oxynitride film and a metal boron oxycarbonitride film, as well as the silicon nitride film, the silicon oxynitride film, the silicon oxycarbide film, the silicon oxycarbonitride film, the silicon boron oxide film, the silicon boron oxynitride film and the silicon boron oxycarbonitride film, and even in this case, the same effect as of the above-mentioned embodiment can be obtained. That is, the present invention may be preferably applied to the case in which a nitride film, an oxynitride film, an oxycarbide film, an oxycarbonitride film, a boron oxide film, a boron oxynitride film, or a boron oxycarbonitride film, including a predetermined element such as a semiconductor element, a metal element, or the like, is formed.

In addition, in the above-mentioned embodiment, while the case in which the thin film is formed using the batch type substrate processing apparatus for processing a plurality of substrates at a time has been described, the present invention is not limited thereto but may be applied to the case in which the thin film is formed using a single wafer type substrate processing apparatus for processing one or a plurality of substrates at a time. In addition, in the above-mentioned embodiment, while the example in which the thin film is formed using the substrate processing apparatus including the hot wall type processing furnace has been described, the present invention is not limited thereto but may be applied to the case in which the thin film is formed using the substrate processing apparatus including a cold wall type processing furnace. Even in this case, for example, the processing condition is the same as that of the above-mentioned embodiment.

In addition, the embodiments, variants or applications may be appropriately combined and used. Further, here, for example, the processing condition may be the same as in the above-mentioned embodiment.

In addition, for example, the present invention is realized even when the process recipe of the substrate processing apparatus of the related art is varied. When the process recipe is changed, the process recipe according to the present invention may be installed at the substrate processing apparatus of the related art via an electrical communication line or a non-transitory computer-readable recording medium on which the process recipe is stored, or the process recipe itself may be exchanged with a process recipe according to the present invention by manipulating the input/output device of the substrate processing apparatus of the related art.

EXAMPLE

In an example, SiON films were formed on a plurality of wafers by the film-forming sequence of the above-mentioned embodiment using the substrate processing apparatus of the above-mentioned embodiment. $Si_2Cl_6O$ gas was used as a source gas and plasma-excited or thermally excited $NH_3$ gas was used as a reactive gas. A wafer temperature upon the film-forming was a temperature within a range of 500 to 700° C. Other processing conditions were set to predetermined values in the range of the processing condition described in the above-mentioned embodiment.

In addition, the processing conditions were changed to draft a plurality of estimation samples, and a refractive index (hereinafter referred to as R.I.) of each SiON film, oxygen concentration and nitrogen concentration through X-ray fluorescence analysis (XRF), and film thickness uniformity in a surface of the wafer (hereinafter referred to as WiW) were measured.

As a result, it was confirmed that the R.I.s of the formed films were 1.73 to 1.78, and all films were appropriate SiON films. In addition, it was confirmed that the oxygen concentration in the formed SiON film was 19.0 to 28.0 at %, and the nitrogen concentration was 10.0 to 28.1 at %. Further, it was confirmed that the nitrogen concentration in the film could be increased more and the oxygen concentration in the film could be decreased more using the plasma-excited $NH_3$ gas than using the thermally excited $NH_3$ gas. For example, in the case in which the film was formed at 700° C., when the plasma-excited $NH_3$ gas was used, the nitrogen concentration in the SiON film was 28.1 at % and the oxygen concentration was 20.5 at %. However, when the thermally excited $NH_3$ gas was used, the nitrogen concentration in the SiON film was 18.5 at %, and the oxygen concentration was 21.2 at %. In addition, it was confirmed that all WiWs of the formed SiON films were 2% or less, and good wafer in-surface film thickness uniformity was obtained.

According to the present invention, it is possible to provide a method of manufacturing a semiconductor device, a substrate processing apparatus and a non-transitory computer-readable recording medium, that are capable of forming a thin film having good film thickness uniformity and a good step coverage property at a low hydrogen concentration.

Exemplary Modes of the Invention

Hereinafter, exemplary modes of the present invention will be supplementarily stated.

(Supplementary Note 1)

According to an aspect of the present invention, there is provided a method of manufacturing a semiconductor device, including forming a film including a predetermined element, oxygen and at least one element selected from a group consisting of nitrogen, carbon and boron on a substrate by performing a cycle a predetermined number of times, the cycle including: (a) supplying a source gas to the substrate wherein the source gas contains the predetermined element, chlorine and oxygen with a chemical bond of the predetermined element and oxygen; and (b) supplying a reactive gas to the substrate wherein the reactive gas contains the at least one element selected from the group consisting of nitrogen, carbon and boron.

(Supplementary Note 2)

In the method of manufacturing the semiconductor device according to supplementary note 1, it is preferable that the cycle is performed a predetermined number of times under condition where at least a portion of the chemical bond of the predetermined element and oxygen in the source gas is maintained.

(Supplementary Note 3)

In the method of manufacturing the semiconductor device according to supplementary note 1 or supplementary note 2, it is preferable that the step (a) is performed under condition where at least a portion of the chemical bond of the predetermined element and oxygen in the source gas is maintained.

(Supplementary Note 4)

In the method of manufacturing the semiconductor device according to any one of supplementary notes 1 to 3, it is preferable that the step (a) includes forming a layer including the predetermined element and oxygen on the substrate under condition where at least a portion of the chemical bond of the predetermined element and oxygen in the source gas is maintained, and the step (b) includes modifying the layer including the predetermined element and oxygen under condition where at least a portion of the chemical bond of the predetermined element and oxygen included in the layer including the predetermined element and oxygen is maintained.

(Supplementary Note 5)

In the method of manufacturing the semiconductor device according to any one of supplementary notes 1 to 4, it is preferable that the step (a) includes forming a layer including the predetermined element and oxygen on the substrate under condition where at least a portion of the chemical bond of the predetermined element and oxygen in the source gas is maintained, and the step (b) includes modifying the layer including the predetermined element and oxygen into the layer including the predetermined element, oxygen and the at least one element selected from a group consisting of nitrogen, carbon and boron under condition where at least a portion of the chemical bond of the predetermined element and oxygen included in the layer including the predetermined element and oxygen is maintained.

(Supplementary Note 6)

In the method of manufacturing the semiconductor device according to any one of supplementary notes 1 to 5, it is preferable that the source gas includes a siloxane.

(Supplementary Note 7)

In the method of manufacturing the semiconductor device according to any one of supplementary notes 1 to 6, it is preferable that the source gas includes at least one selected from a group consisting of hexachlorodisiloxane, tetrachlorodisiloxane, pentachlorodisiloxane, octachlorotrisiloxane, decachlorotetrasiloxane and dodecachloropentasiloxane.

(Supplementary Note 8)

In the method of manufacturing the semiconductor device according to any one of supplementary notes 1 to 7, it is preferable that the source gas includes hexachlorodisiloxane.

(Supplementary Note 9)

In the method of manufacturing the semiconductor device according to any one of supplementary notes 1 to 8, it is preferable that the reactive gas includes at least one selected from the group consisting of a nitrogen-containing gas (nitriding gas), a carbon-containing gas (hydrocarbon-based gas), a gas containing nitrogen and carbon (amine-based gas, organic hydrazine-based gas), a boron-containing gas (borazine-based gas), and a gas containing boron, nitrogen and carbon.

(Supplementary Note 10)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into an oxynitride film including the predetermined element (a layer including the predetermined element, oxygen and nitrogen) by supplying a nitrogen-containing gas as the reactive gas.

(Supplementary Note 11)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into an oxycarbide layer including the predetermined element (a layer including the predetermined element, oxygen and carbon) by supplying a carbon-containing gas as the reactive gas.

(Supplementary Note 12)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (an oxide layer including the predetermined element) into an oxycarbonitride layer including the predetermined element (a layer including the predetermined element, oxygen, carbon and nitrogen) by supplying a carbon-containing gas and a nitrogen-containing gas as the reactive gas.

(Supplementary Note 13)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into an oxycarbonitride layer including the predetermined element (a layer including the predetermined element, oxygen, carbon and nitrogen) by supplying a gas containing nitrogen and carbon as the reactive gas.

(Supplementary Note 14)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into a boron oxide layer including the predetermined element (a layer including the predetermined element, boron and oxygen) by supplying a boron-containing gas as the reactive gas.

(Supplementary Note 15)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into a boron oxynitride layer including the predetermined element (a layer including the predetermined element, boron, oxygen and nitrogen) by supplying a boron-containing gas and a nitrogen-containing gas as the reactive gas.

(Supplementary Note 16)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into a boron oxycarbonitride layer including the predetermined element (a layer including the predetermined element, boron, oxygen, carbon and nitrogen) by supplying a boron-containing gas, a carbon-containing gas and a nitrogen-containing gas as the reactive gas.

(Supplementary Note 17)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into a boron oxycarbonitride layer including the predetermined element (a layer including the predetermined element, boron, oxygen, carbon and nitrogen) by supplying a gas containing boron, nitrogen and carbon as the reactive gas.

(Supplementary Note 18)

In the method of manufacturing the semiconductor device according to any one of supplementary notes 1 to 9, it is preferable that the step (a) includes forming a layer including the predetermined element and oxygen (an oxide layer including the predetermined element) on the substrate, and the step (b) includes modifying the layer including the predetermined element and oxygen (the oxide layer including the predetermined element) into a boron oxycarbonitride layer including the predetermined element (a layer including the predetermined element, boron, oxygen, carbon and nitrogen) by supplying a gas containing boron, nitrogen and carbon and a nitrogen-containing gas as the reactive gas.

(Supplementary Note 19)

In the method of manufacturing the semiconductor device according to any one of supplementary notes 1 to 18, it is preferable that the predetermined element includes at least one of a semiconductor element and a metal element.

(Supplementary Note 20)

In the method of manufacturing the semiconductor device according to any one of supplementary notes 1 to 18, it is preferable that the predetermined element includes silicon.

(Supplementary Note 21)

According to another aspect of the present invention, there is provided a method of processing a substrate, including forming a film including at least one element selected from a group consisting of nitrogen, carbon and boron, a predetermined element and oxygen on a substrate by performing a cycle a predetermined number of times, the cycle including:

supplying a source gas containing the predetermined element, chlorine and oxygen and having a chemical bond of the predetermined element and the oxygen to the substrate; and supplying a reactive gas containing at least one element selected from the group consisting of nitrogen, carbon and boron to the substrate.

(Supplementary Note 22)

According to still another aspect of the present invention, there is provided a substrate processing apparatus including:

a processing chamber accommodating a substrate;

a source gas supply system configured to supply a source gas to the substrate in the processing chamber wherein the source gas contains a predetermined element, chlorine and oxygen with a chemical bond of the predetermined element and oxygen;

a reactive gas supply system configured to supply a reactive gas to the substrate in the processing chamber wherein the reactive gas contains at least one element selected from a group consisting of nitrogen, carbon and boron; and a control unit configured to control the source gas supply system and the reactive gas supply system to form a film including the predetermined element, oxygen and the at least one element selected from the group consisting of nitrogen, carbon and boron on the substrate by performing a cycle a predetermined number of times, the cycle including supplying the source gas to the substrate in the processing chamber and supplying the reactive gas to the substrate in the processing chamber.

(Supplementary Note 23)

According to still another aspect of the present invention, there are provided a non-transitory computer-readable recording medium storing a program for causing a computer to execute a sequence of forming a film including a predetermined element, oxygen and at least one element selected from a group consisting of nitrogen, carbon and boron on a substrate by performing a cycle a predetermined number of times, the cycle including:

supplying a source gas to the substrate in a processing chamber wherein the source gas contains the predetermined element, chlorine and oxygen with a chemical bond of the predetermined element and oxygen; and supplying a reactive gas to the substrate in the processing chamber wherein the reactive gas contains the at least one element selected from the group consisting of nitrogen, carbon and boron.

What is claimed is:

1. A method of manufacturing a semiconductor device, comprising forming a film including a predetermined element, oxygen and at least one element selected from a group consisting of nitrogen, carbon and boron on a substrate by performing a cycle a predetermined number of times, the cycle including alternatively performing:

(a) supplying a source gas to the substrate wherein the source gas contains the predetermined element, chlorine and oxygen with a chemical bond of the predetermined element and oxygen; and (b) supplying a reactive gas to the substrate wherein the reactive gas contains the at least one element selected from the group consisting of nitrogen, carbon and boron, wherein a temperature of the substrate ranges from 700° C. to 900° C. when forming the film.

2. The method according to claim 1, wherein the cycle is performed a predetermined number of times under condition where at least a portion of the chemical bond of the predetermined element and oxygen in the source gas is maintained.

3. The method according to claim 1, wherein the step (a) is performed under condition where at least a portion of the chemical bond of the predetermined element and oxygen in the source gas is maintained.

4. The method according to claim 1, wherein the step (a) comprises forming a layer including the predetermined element and oxygen on the substrate under condition where at least a portion of the chemical bond of the predetermined element and oxygen in the source gas is maintained, and the step (b) comprises modifying the layer including the predetermined element and oxygen under condition where at least a portion of the chemical bond of the predetermined element and oxygen included in the layer including the predetermined element and oxygen is maintained.

5. The method according to claim 1, wherein the step (a) comprises forming a layer including the predetermined element and oxygen on the substrate under condition where at least a portion of the chemical bond of the predetermined element and oxygen in the source gas is maintained, and the step (b) comprises modifying the layer including the predetermined element and oxygen into the layer including the predetermined element, oxygen and the at least one element selected from a group consisting of nitrogen, carbon and boron under condition where at least a portion of the chemical bond of the predetermined element and oxygen included in the layer including the predetermined element and oxygen is maintained.

6. The method according to claim 1, wherein the source gas comprises a siloxane.

7. The method according to claim 1, wherein the source gas comprises at least one selected from a group consisting of hexachlorodisiloxane, tetrachlorodisiloxane, pentachlorodisiloxane, octachlorotrisiloxane, decachlorotetrasiloxane and dodecachloropentasiloxane.

8. The method according to claim 1, wherein the reactive gas comprises at least one selected from the group consisting of a nitrogen-containing gas, a carbon-containing gas, a gas containing nitrogen and carbon, a boron-containing gas, and a gas containing boron, nitrogen and carbon.

9. The method according to claim 1, wherein the step (a) comprises forming a layer including the predetermined element and oxygen on the substrate, and the step (b) comprises modifying the layer including the predetermined element and oxygen into a layer including the predetermined element, oxygen and nitrogen by supplying a nitrogen-containing gas as the reactive gas.

10. The method according to claim 1, wherein the step (a) comprises forming a layer including the predetermined element and oxygen on the substrate, and the step (b) comprises modifying the layer including the predetermined element and oxygen into a layer including the predetermined element, oxygen and carbon by supplying a carbon-containing gas as the reactive gas.

11. The method according to claim 1, wherein the step (a) comprises forming a layer including the predetermined element and oxygen on the substrate, and the step (b) comprises modifying the layer including the predetermined element and oxygen into a layer including the predetermined element, oxygen, carbon and nitrogen by supplying a carbon-containing gas and a nitrogen-containing gas as the reactive gas.

12. The method according to claim 1, wherein the step (a) comprises forming a layer including the predetermined element and oxygen on the substrate, and the step (b) comprises modifying the layer including the predetermined element and oxygen into a layer including the predetermined element, oxygen, carbon and nitrogen by supplying a gas containing nitrogen and carbon as the reactive gas.

13. The method according to claim 1, wherein the step (a) comprises forming a layer including the predetermined element and oxygen on the substrate, and the step (b) comprises modifying the layer including the predetermined element and oxygen into a layer including the predetermined element, boron and oxygen by supplying a boron-containing gas as the reactive gas.

14. The method according to claim 1, wherein the step (a) comprises forming a layer including the predetermined element and oxygen on the substrate, and the step (b) comprises modifying the layer including the predetermined element and oxygen into a layer including the predetermined element, boron, oxygen and nitrogen by supplying a boron-containing gas and a nitrogen-containing gas as the reactive gas.

15. The method according to claim 1, wherein the step (a) comprises forming a layer including the predetermined element and oxygen on the substrate, and the step (b) comprises modifying the layer including the predetermined element and oxygen into a layer including the predetermined element, boron, oxygen, carbon and nitrogen by supplying a boron-containing gas, a carbon-containing gas and a nitrogen-containing gas as the reactive gas.

16. The method according to claim 1, wherein the step (a) comprises forming a layer including the predetermined element and oxygen on the substrate, and the step (b) comprises modifying the layer including the predetermined element and oxygen into a layer including the predetermined element, the boron, oxygen, carbon and nitrogen by supplying a gas containing boron, nitrogen and carbon as the reactive gas.

17. The method according to claim 1, wherein the step (a) comprises forming a layer including the predetermined element and oxygen on the substrate, and the step (b) comprises modifying the layer including the predetermined element and oxygen into a layer including the predetermined element, boron, oxygen, carbon and nitrogen by supplying a gas containing boron, nitrogen and carbon and a nitrogen-containing gas as the reactive gas.

18. The method according to claim 1, wherein the reactive gas includes at least one selected from a group consisting of an ethylamine-based gas, a methylamine-based gas, a propylamine-based gas, an isopropylamine-based gas, a butylamine-based gas and an isobutylamine-based gas.

19. The method according to claim 1, wherein the reactive gas includes an organic hydrazine-based gas.

20. A method of manufacturing a semiconductor device, comprising forming a film including a predetermined element, oxygen and at least one element selected from a group consisting of nitrogen, carbon and boron on a substrate by performing a cycle a predetermined number of times, the cycle including alternately performing:

(a) supplying a source gas to the substrate wherein the source gas contains the predetermined element, chlorine and oxygen with a chemical bond of the predetermined element and oxygen; and (b) supplying a reactive gas to the substrate wherein the reactive gas includes at least one selected from a group consisting of an ethylamine-based gas, a methylamine-based gas, a propylamine-based gas, an isopropylamine-based gas, a butylamine-based gas, and an isobutylamine-based gas.

21. A method of manufacturing a semiconductor device, comprising forming a film including a predetermined element, oxygen and at least one element selected from a group consisting of nitrogen, carbon and boron on a substrate by performing a cycle a predetermined number of times, the cycle including alternately performing:

(a) supplying a source gas to the substrate wherein the source gas contains the predetermined element, chlorine and oxygen with a chemical bond of the predetermined element and oxygen; and (b) supplying a reactive gas to the substrate wherein the reactive gas includes an organic hydrazine-based gas.

* * * * *